United States Patent [19]

Takayama et al.

[11] Patent Number: 5,501,989
[45] Date of Patent: Mar. 26, 1996

[54] METHOD OF MAKING SEMICONDUCTOR DEVICE/CIRCUIT HAVING AT LEAST PARTIALLY CRYSTALLIZED SEMICONDUCTOR LAYER

[75] Inventors: Toru Takayama; Yasuhiko Takemura, both of Kanagawa, Japan

[73] Assignee: Semiconductor Energy Laboratory Co., Ltd., Kanagawa, Japan

[21] Appl. No.: 216,107

[22] Filed: Mar. 21, 1994

[30] Foreign Application Priority Data

| Mar. 22, 1993 | [JP] | Japan | 5-086744 |
| Mar. 22, 1993 | [JP] | Japan | 5-086745 |
| Mar. 22, 1993 | [JP] | Japan | 5-086746 |
| Mar. 22, 1993 | [JP] | Japan | 5-086747 |

[51] Int. Cl.⁶ .......................... H01L 21/335; H01L 21/84
[52] U.S. Cl. .................. 437/21; 437/41; 437/101; 437/953; 257/350
[58] Field of Search .............. 437/21, 41, 101, 437/909, 953; 257/350

[56] References Cited

U.S. PATENT DOCUMENTS

| 4,727,044 | 2/1988 | Yamazaki | 437/45 |
| 5,147,826 | 9/1992 | Liu et al. | 437/233 |
| 5,275,851 | 1/1994 | Fonash et al. | 427/578 |

OTHER PUBLICATIONS

C. Hayzelden et al., "*In Situ* Transmission Electron Microscopy Studies of Silicide–Mediated Crystallization of Amorphous Silicon", Mar. 1993, pp. 921–924.

A. V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640, 1990.

T. Hempel et al., "Needle–Like Crystallization of Ni Doped Amorphous Silicon Thin Films", *Solid State Communications*, vol. 85, No. 11, pp. 921–924, 1993.

*Primary Examiner*—George Fourson
*Assistant Examiner*—Richard A. Booth
*Attorney, Agent, or Firm*—Sixbey, Friedman, Leedom & Ferguson; Gerald J. Ferguson, Jr.

[57] ABSTRACT

Amorphous silicon in impurity regions (source and drain regions or N-type or p-type regions) of TFT and TFD are crystallized and activated to lower electric resistance, by depositing film having a catalyst element such as nickel (Ni), iron (Fe), cobalt (Co) or platinum (Pt) on or beneath an amorphous silicon film, or introducing such a catalyst element into the amorphous silicon film by ion implantation and subsequently crystallizing the same by applying heat annealing at an appropriate temperature.

15 Claims, 10 Drawing Sheets

5,501,989

METHOD OF MAKING SEMICONDUCTOR DEVICE/CIRCUIT HAVING AT LEAST PARTIALLY CRYSTALLIZED SEMICONDUCTOR LAYER

BACKGROUND OF THE INVENTION

1. Field of the Invention

The present invention relates to a semiconductor device/circuit having at least partially crystallized semiconductor layer and a manufacturing method thereof. The semiconductor device/circuit manufactured according to the present invention is formed on any of insulation substrates such as glass substrates and semiconductor substrates such as single crystal silicon substrates. In particular, the present invention relates to a semiconductor device/circuit having a thin film transistor (TFT) and/or a thin film diode (TFD) (for example, image sensor) manufactured by way of crystallization (activation) through heat annealing.

2. Description of the Prior Art

Thin film semiconductor devices such as TFT and TFD are classified into amorphous devices and crystalline devices depending on the crystalline structures of the semiconductor materials used. Amorphous silicon can be fabricated at a low temperature and shows excellent mass productivity. However, it is inferior to crystalline silicon in view of physical properties such as field effect mobility or conductivity. So it has been demanded for crystalline semiconductor devices in order to obtain high speed characteristics. On the other hand, it has been known that amorphous semiconductors are usable, for example, to light sensors since they generally show large change in the photoconductivity. It has been proposed recently a circuit for driving a light sensor using an amorphous silicon diode or a thin film diode by a thin film transistor using crystalline silicon capable of high speed operation (for example, integrated image sensor circuit).

FIGS. 1A–1E show an example for the steps of fabricating a circuit comprising a combination of an amorphous silicon diode and a crystalline silicon TFT in the prior art. An underlying insulation film 51 is formed on a glass substrate 50, over which an amorphous silicon film is formed and crystallized by applying long time annealing at a temperature higher than 800° C. Then, it is patterned to obtain an island-like silicon region 52. Then, a gate insulation film 53 is formed and, further, gate electrodes 54N and 54P are formed (refer to FIG. 1A).

Then, an N-type impurity region 55N and a p-type impurity region 55P are formed by using known CMOS fabrication technique. In this impurity introduction step, an impurity element is introduced into a semiconductor layer with a gate electrode as a mask in a self-aligning manner. After the implantation of impurities, the impurities are activated by laser annealing, heat annealing or like other means (refer to FIG. 1B).

Then, a first interlayer insulator 56 is formed through which contact holes are formed, thereby forming electrode/wiring 57a, 57b, 57c for source and drain of TFT, and an electrode 57d for an amorphous silicon diode (FIG. 1C).

Then, p-, I- (intrinsic) and N-type amorphous silicon films 58P, 58I and 58N are successively laminated, which are then patterned to form a diode junction portion (FIG. 1D).

Finally, a second interlayer insulator 59 is formed through which contact holes are formed thereby forming an electrode 60 of the amorphous silicon diode to complete a circuit (FIG. 1E).

In the prior art method requiring such procedures, it is necessary to form silicon films 52, 58I and the interlayer insulators 56, 59 each by two layers, which requires film formation for long time and, in addition, the N-type layer 58N and the p-type layer 58P have to be formed. Therefore, it involves a problem that the throughput is reduced. Further, a plasma CVD or vacuum CVD process used for forming such films, takes much dead time for the maintenance of the apparatus and the presence of such additional step further reduces the throughput.

Furthermore, since crystallization of the silicon film used in the crystalline silicon TFT also requires a temperature higher than 600° C. and needs a time as much as 24 hours or longer for crystallization, many facilities for crystallization apparatus are required in actual mass production, which results in enormous installation cost.

SUMMARY OF THE INVENTION

An object of the present invention is to provide a technique capable of overcoming the foregoing problems by simultaneously forming a semiconductor layer to form a TFT and a TFD using only a single interlayer insulator, as well as crystallizing the silicon film at a temperature lower than 600° C. and in such a short period of time as causing no substantial problems.

Another object of the present invention is to provide a method capable of simplifying production processes and saving the number of film-forming steps.

A further object of the present invention is to improve crystallization and activation of amorphous silicon, in particular, in an impurity region of TFT and TFD (source, drain or n-type or p-type region), thereby lowering the resistivity.

A further object of the present invention is to lower the resistivity in an impurity region by annealing at a lower temperature and for a shorter period of time.

A further object of the present invention is to obtain crystalline silicon by low temperature and short time annealing and then using the same to TFT.

A further object of the present invention is to provide a semiconductor circuit in which source, drain of TFT and N-type and p-type regions of TFD are constituted with crystalline silicon, while an active region (channel forming region) of TFT and an I-layer of TFD is constituted with amorphous silicon, as well as a manufacturing method therefor.

A further object of the present invention is to provide a semiconductor circuit in which the source, drain regions of TFT are constituted with crystalline silicon, while an active region of TFT and TFD are constituted with amorphous silicon, as well as a manufacturing method thereof.

A further object of the present invention is to provide a semiconductor circuit, in which an active region of a TFT is constituted with crystalline silicon, while an intrinsic region of a TFD is constituted with amorphous silicon, as well as manufacturing method therefor.

A further object of the present invention is to provide a semiconductor device/circuit in which TFT and/or TFD are formed from one semiconductor film, as well as a manufacturing method thereof.

A further object of the present invention is to provide a method of manufacturing a semiconductor device/circuit capable of attaining a satisfactory light sensitivity.

A further object of the present invention is to provide a method of manufacturing a semiconductor device/circuit capable of crystallizing an active region not introduced with a catalyst element by laterally proceeding crystallization.

A further object of the present invention is to provide a method of manufacturing a semiconductor device/circuit capable of optionally fabricating a crystalline semiconductor region, and an amorphous semiconductor region.

A further object of the present invention is to provide a semiconductor device/circuit containing TFT of extremely high mobility.

The primary feature of the present invention is to add a catalytic element to a selected portion of a semiconductor film for reducing the crystallization temperature in the selected portion and to subject the semiconductor film to a heat annealing at such a temperature which is enough high to crystallize the impurity added portion but not enough high to crystallize the remaining portion of the semiconductor film, thereby, crystallizing only the selected portion of the semiconductor film.

According to the study of the present inventor, it has been found that one of most major problems of the amorphous silicon TFT is caused by that the conductivity of source, drain regions is remarkably low. It has been found that a satisfactory operation for driving a TFD is obtainable if the conductivity of the source, drain regions of a TFT is comparable with that of crystalline silicon. It has also been found that the problem in the amorphous silicon TFD is attributable to that the conductivity of the n-type and p-type regions is low.

The foregoing problems can be solved by proceeding crystallization and activation thereby lowering the resistivity of amorphous silicon, particularly, in impurity regions (source, drain regions or n-type and p-type regions), of TFT and/or TFD. As a result of the studies conducted by the present inventor, it has been found that crystallization can be promoted by adding a trace amount of a catalyst material to a silicon film in a substantially amorphous state thereby enabling to lower the crystallization temperature and shorten the crystallization time. In the present invention, the amorphous state and the substantially amorphous state include a so-called amorphous state and an extremely degraded crystalline state if it is present. As the catalyst element, nickel (Ni), iron (Fe), cobalt (Co) or platinum (Pt) is suitable. Actually, crystallization can be attained by forming a film, particles, cluster or the like containing such a catalyst in the form of elemental metal or a compound such as silicide in an intimate contact on or below an amorphous silicon film or introducing such a catalyst element into the amorphous silicon film by an ion implantation or like other method and, subsequently, applying heat annealing at an appropriate temperature, typically, at a temperature below 580° C.

As a matter of fact, there is such a relation that the crystallization time is shorter as the annealing temperature is higher. Further, there is also a relation that the crystallization temperature is lower and the crystallization time is shorter as the concentration of the catalyst element is greater. According to the study of the present inventor, it has been found that at least one of the elements has to be present at a concentration of higher than $1 \times 10^{17}$ cm$^{-3}$, preferably, $5 \times 10^{18}$ cm$^{-3}$. Also, depending upon the annealing temperature and period, the catalytic element diffuses by 10–20 μm and the crystallization proceeds in a lateral direction.

On the other hand, since most of the catalyst materials described above is not preferred for an electrical characteristics of silicon, it is desirable that the concentration is as low as possible. According to the study of the present inventor, it is desired that the concentration of the catalyst material does not exceed $2 \times 10^{20}$ cm$^{-3}$, preferably, $1 \times 10^{20}$ cm$^{-3}$ in total in order to attain sufficient reliability and characteristic, particularly, when it is utilized as an active region. It has been found on the other hand that there is no substantial problem in the source or drain region if the catalyst is present relatively in a large amount. Particularly, it has been found that the concentration of the catalyst element contained in the active region (channel-forming region) of TFT is desirably smaller by more than one digit as that in the source, drain regions in the first feature of the present invention. In the same way, it is also desired in TFD that the concentration of the catalyst element contained in the intrinsic region (I-layer) is lower by more than one digit than that in the impurity region (n-type or p-type region).

Further, it should be noted that the amorphous state can be maintained without proceeding crystallization at all in such a region that the catalyst material is not present. For instance, crystallization of amorphous silicon not having such a catalyst material, usually starts at a temperature higher than 600° C. but it does not proceed at all at a temperature lower than 580° C. However, since hydrogen necessary for neutralizing dangling bonds in amorphous silicon is dissociated, in an atmosphere at a temperature higher than 300° C., it is desirable that annealing is applied in a hydrogen atmosphere in order to attain a satisfactory light sensitivity.

Further, such a catalyst element has an effect of crystallizing a peripheral area by diffusion during annealing. For instance, when annealing is applied at 550° C. for four hours, the catalyst element diffuses to the periphery as far as by 10–20 μm to cause crystallization therein. Accordingly, if the width of the gate electrode of TFT is less than 20 μm, preferably, less than 10 μm, crystallization proceeds laterally, and an active region (channel-forming region) not introduced with the catalyst element can also be crystallized by introducing the catalyst element into the source, drain regions before or after introduction of the n-type or p-type impurities and then applying annealing. Further, in this method, the concentration of the catalyst element in the active region is generally low as compared with the concentration of the catalyst element in the source, drain regions. The lateral crystallization depends on the temperature and the time of annealing and the concentration of the catalyst element. Accordingly, the crystalline silicon region and the amorphous silicon region can be prepared optionally by optimizing them.

For instance, when two kinds of TFT gate electrodes having, respectively, 5 μm and the 30 μm width are provided, it is possible to prepare a crystalline silicon TFT from the 5 μm width electrode, while an amorphous silicon TFT from the 30 μm width electrode.

Taking notice on the effect of the catalyst element and by utilizing the same, the present inventor has succeeded in lowering the resistivity in the impurity region by low temperature and short time annealing thereby obtaining crystalline silicon and using it for TFT.

In the first feature of the present invention, only the impurity region is crystallized and activated by taking an advantageous feature of the crystallization due to the catalyst material while the active region of TFT and the intrinsic region of TFD are left as they are in the amorphous state, thereby improving the function of the device. The present inventor has made a further study and has found a method capable of simplifying the process, that is, saving the number of film-forming steps as other object described above. The outline of the method is shown below.

(1) Formation of an amorphous semiconductor (silicon) film
(2) Formation of an insulation film (gate insulation film)
(3) Formation of a TFT gate electrode and a mask material for a TFD
(4) Introduction of doping impurity (for example by ion implantation or ion doping method)
(4') Formation of catalyst element-containing material on a semiconductor (silicon) film
(5) Activation of doped impurity (possible at a temperature lower than 600° C. and within 8 hours)
(6) Formation of an interlayer insulator
(7) Formation of source and drain electrodes of TFT, or alternatively,
(1) Formation of an amorphous semiconductor (silicon) film
(2) Formation of an insulation film (gate insulation film)
(3) Formation of a TFT gate electrode and a mask material for a TFD
(4) Introduction of doping impurity (for example, by ion implantation or ion doping method)
(4') Introduction of catalyst element (for example by ion implantation or ion doping method)
(5) Activation of doped impurity (possible at a temperature lower than 600° C. and within 8 hours)
(6) Formation of an interlayer insulator
(7) Formation of source and drain electrodes of TFT.

In the second feature of the present invention, only the impurity region of TFT is crystallized and activated by taking an advantageous feature of the crystallization due to the catalyst material while TFD is left as it is in the amorphous state thereby improving the function of the device. The present inventor has made a further study and has found a method capable of simplifying the process, that is, saving the number of film-forming steps as other object described above. The outline of the method is shown below.

(1) Formation of an amorphous semiconductor (silicon) film
(2) Formation of an insulation film (gate insulation film)
(3) Formation of a TFT gate electrode and a mask material for a TFD
(4) Introduction of doping impurity (for example, by ion implantation or ion doping method)
(4') Formation of catalyst element-containing material on the semiconductor (silicon) film in the TFT region
(5) Activation of doped impurity (possible at a temperature lower than 600° C. and within 8 hours)
(6) Formation of an interlayer insulator
(7) Formation of source and drain electrodes of TFT, or, alternatively,
(1) Formation of an amorphous semiconductor (silicon) film
(2) Formation of an insulation film (gate insulation film)
(3) Formation of a TFT gate electrode and a mask material for a TFD
(4) Introduction of doping impurity (for example, by ion implantation or ion doping method)
(4') Introduction of catalyst element into the semiconductor (silicon) film in the TFT region (for example, by ion implantation or ion doping method)
(5) Activation of doped impurity (possible at a temperature lower than 600° C. and within 8 hours)
(6) Formation of an interlayer insulator
(7) Formation of source and drain electrodes of TFT.

In the third feature of the present invention, only the TFT is crystallized and activated by taking an advantageous feature of crystallization due to the catalyst material while TFD is left as it is in the amorphous state thereby improving the function of the device. The present inventor has made a further study and found a method capable of simplifying the process, that is, saving the number of film-forming steps as other object described above. The outline of the method is shown below.

(1) Formation of an amorphous semiconductor (silicon) film
(1' Formation of a catalyst element-containing material on or in contact with a semiconductor (silicon) film in the TFT region
(2) Formation of an insulation film (gate insulation film)
(3) Formation of a TFT gate electrode and a mask material for a TFD
(4) Introduction of doping impurity (for example, by ion implantation or ion doping method)
(5) Activation of doped impurity (possible at a temperature lower than 600° C. and within 8 hours)
(6) Formation of an interlayer insulator
(7) Formation of source and drain electrodes of TFT or, alternatively,
(1) Formation of an amorphous semiconductor (silicon) film
(1') Introduction of a catalyst element into the semiconductor (silicon) film in the TFT region (for example, by ion implantation or ion doping method)
(2) Formation of an insulation film (gate insulation film)
(3) Formation of a TFT gate electrode and a mask material for a TFD
(4) Introduction of doping impurity ( for example, by ion implantation or ion doping method)
(5) Activation of doped impurity (possible at a temperature lower than 600° C. and within 8 hours)
(6) Formation of an interlayer insulator
(7) Formation of source and drain electrodes of TFT.

In the fourth feature of the present invention, the present inventor has found a method capable of simplifying the process, that is, saving the number of film-forming steps as the object described above by crystallizing and activating the impurity regions and the active region of TFT and the intrinsic region of TFD at a temperature lower than that in the prior art. The outline is shown below.

(1) Formation of an amorphous semiconductor (silicon) film
(1') Introduction of a catalyst element (for example, by ion implantation or ion doping method) (catalyst element-containing material in the form of a film may be provided on a silicon film)
(2) Formation of an insulation film (gate insulation film)
(3) Formation of a TFT gate electrode and a mask material for a TFD
(4) Introduction of doping impurity (for example, by ion implantation or ion doping method)
(5) Activation of doped impurity (possible at a temperature lower than 600° C. and within 8 hours)
(6) Formation of an interlayer insulator
(7) Formation of source and drain electrodes of TFT or, alternatively, (1) Formation of an amorphous semiconductor (silicon) film (2) Formation of an insulation film (gate insulation film)

(3) Formation of a TFT gate electrode and a TFD mask material (4) Introduction of doping impurity (for example, by ion implantation or ion doping method)

(4') Introduction of a catalyst element (for example, by ion implantation or ion doping method) (catalyst element-containing material in the form of a film may be provided on a silicon film)

(5) Activation of doped impurity (possible at a temperature lower than 600° C. and within 8 hours)

(6) Formation of an interlayer insulator (7) Formation of source and drain electrodes of TFT.

In the steps described above, the sequence for the steps of introducing the doping impurity and the catalyst element conducted one after the other (steps (4) and (4') in the first and the second features and the steps (4) and (4') in the latter alternative steps in the fourth feature) can be reversed. For strictly controlling the concentration of the catalyst element, the ion implantation or like other means is desirable for the step of introducing the catalyst element. Since the catalyst element is present, the annealing temperature lower than 600° C., typically, lower than 550° C. is sufficient for crystallization and activation, as well as the annealing time within 8 hours, typically, within 4 hours is sufficient. In particular, in a case where the catalyst element is distributed homogeneously by the ion implantation or ion doping method, crystallization proceeded extremely readily.

In the present invention, if a gate electrode is present on an active region or a mask material is present on an intrinsic region, the catalyst element is not brought into intimate contact with or implanted into the active region directly in the step for introducing the catalyst element (such as step (4') in the first and the second features of the invention). Accordingly, characteristics of the active region and the intrinsic region are not deteriorated.

Further, if annealing is applied under appropriate conditions for temperature and time, crystallization proceeds from the source, drain regions and the active region also becomes crystalline silicon. As a result, TFT of extremely high mobility can be obtained.

Referring briefly to the structure of TFD in the present invention, the TFD in the prior art has a laminate structure, whereas the present invention has a feature of a planar structure. In the present invention, the active region of TFT and the intrinsic region of TFD start from an identical amorphous silicon film. However, since the catalyst element is not introduced in the TFD region, the region is not crystallized by the subsequent annealing step. This is attained since the annealing temperature in the present invention can be lowered by more than 50° C. than that in the prior art. Therefore, although two layers of silicon films have to be formed in the prior art, it is suffice to form a single silicon film layer in the present invention. Then, the n-type layer and the p-type layer necessary so far can be obtained by forming them simultaneously in a planar structure upon doping impurities in TFT. That is, the n-type region of TFD is formed upon implantation of n-type impurities to TFT, while the p-type region of TFD is formed upon implantation of p-type impurities to TFT. As a result, the interlayer insulator can also be a single layer.

Such a planar TFD has a novel feature not obtainable in the prior art. In a case of using a conventional TFD (having a shape as shown in FIG. 1), for example, as a light sensor, the direction of an electric field generated at the inside of the semiconductor is vertical to a light irradiation plane, so that the light irradiation intensity is not uniform in the direction of the electric field and it has been impossible to efficiently generate electrons and holes and take out them externally. In addition, short-circuit may be caused sometimes to TFD due to pinholes through the layers. In the present invention, since the direction of the electric field generated in TFD is in parallel with the light irradiation plane, the light intensity is constant in the direction of the electric field to improve photoelectric conversion efficiency and, in addition, suppress occurrence of short-circuit.

In the present invention, a thin amorphous silicon film with a thickness of less than 1,000Å, which is not crystallized by usual heat annealing, is also crystallized due to the effect of the catalyst element. It has been required that the thickness of the crystalline silicon film is less than 1,000Å, preferably, less than 500Å with a view point of avoiding pinholes or insulation failure in the gate insulation film and disconnection of the gate electrode at stepped portions of TFT. This can not be attained so far by the method other than laser crystallization but this can be attained in accordance with the present invention by heat annealing even at a low temperature. This is naturally attributable to further improvement of the yield. In addition, in a case of utilizing TFD as a light sensor, S/N ratio and photoelectric conversion efficiency can be improved by using a thin semiconductor film.

According to the present invention, it is possible to save the number of processing steps for fabricating a semiconductor device/circuit having, for example, crystalline silicon TFT and amorphous silicon TFD and improving the productivity. Further, in the present invention, throughput can be improved also by crystallizing silicon, for example, at a temperature as low as 500° C. and at a processing time as short as four hours. In addition, in a case of adopting a process at a temperature higher than 600° C. in the prior art, there has been a problem of causing shrinkage or warp in a glass substrate which leads to the reduction of the yield, whereas such problems can be overcome altogether by utilizing the present invention.

This means that a substrate of a large area can be processed at a time. That is, unit cost can be reduced remarkably by cutting out a number of integrated circuits, etc. from a single substrate by processing a substrate of a large area. Thus, the present invention is of an industrial advantage.

These and other novel features and advantages of the present invention are described in or will become apparent from the following detailed description of preferred embodiments.

BRIEF DESCRIPTION OF THE DRAWINGS

The preferred embodiments will be described with reference to the drawings, wherein like elements have been denoted throughout the figures with like reference numerals, and wherein.

DETAILED DESCRIPTION OF PREFERRED EMBODIMENTS

Description will be made more specifically to the present invention by way of examples.

EXAMPLE 1

Figure 1A:
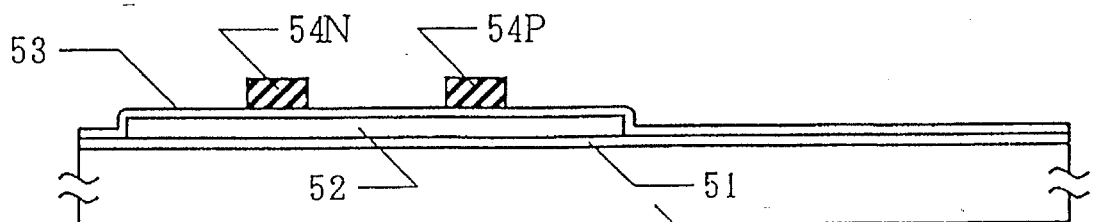
FIGS. 1A–1E are cross sectional views illustrating an example of fabrication steps in the prior art.
Figure 1B:
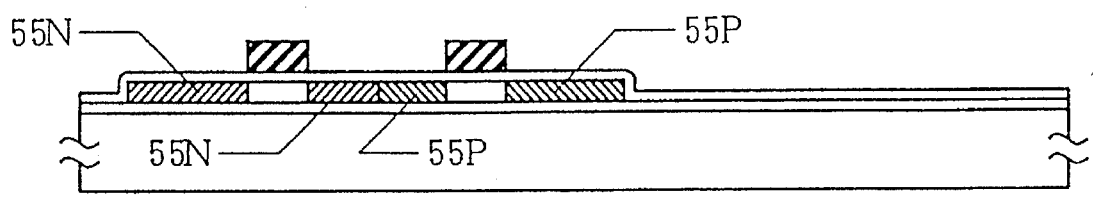
Figure 1C:
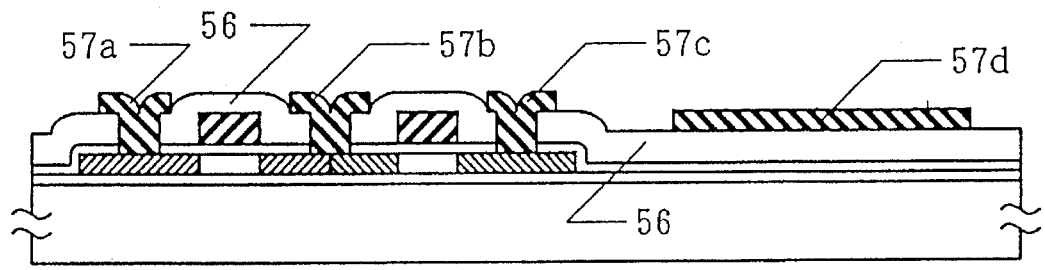
Figure 1D:
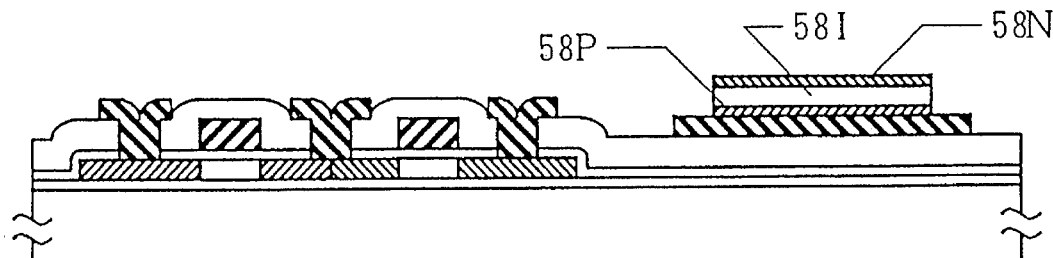
Figure 1E:
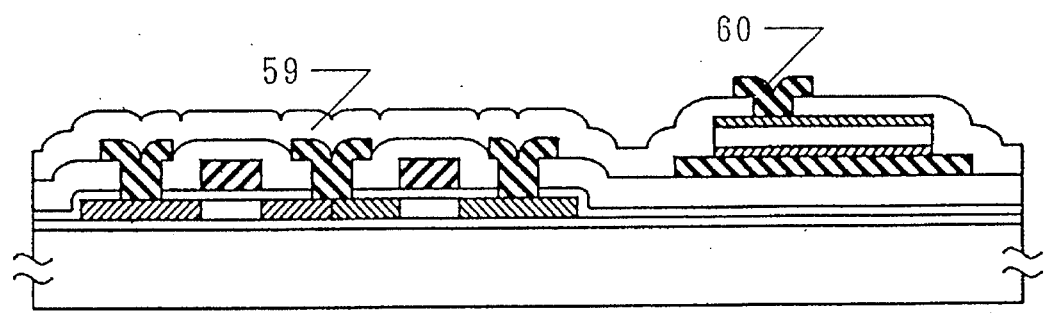
Figure 2A:
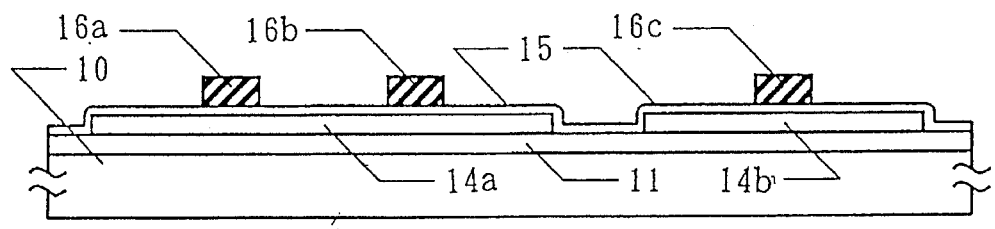
FIGS. 2A–2F are cross sectional views illustrating fabrication steps in Example 1 of the first feature of the present invention.

FIGS. 2A–F illustrate cross sectional views for fabrication steps in Example 1 of the first feature according to the present invention. At first, an underlying film 11 made of silicon oxide was formed to a thickness of 2,000Å by a sputtering method on a substrate (Corning (Trademark) 7059) 10. Further, an intrinsic (I) amorphous silicon film was deposited to a thickness of 500 to 1,500Å, for example, 1,500Å by a plasma CVD process. Then, the thus obtained amorphous silicon film was patterned by photolithography to form an island-like silicon regions 14a (for TFT) and 14b (for TFD). Further, a silicon oxide film 15 was deposited to a thickness of 1,000Å as a gate insulation film by a sputtering method. Sputtering was applied using silicon oxide as a target, at a substrate temperature of 200° to 400° C., for example, at 250° C. in a sputtering atmosphere of oxygen and argon at an argon/oxygen ratio of 0 to 0.5, for example, less than 0.1. Successively, a silicon film (containing 0.1 to 2% phosphorus) was deposited to a thickness of 6,000 to 8,000Å, for example, 6,000Å by a vacuum CVD process. The steps of forming the silicon oxide and the silicon film are desirably conducted continuously. Then, the silicon film was patterned to form gate electrodes 16a and 16b for TFT and a mask material 16c for TFD (FIG. 2A).

Figure 2B:
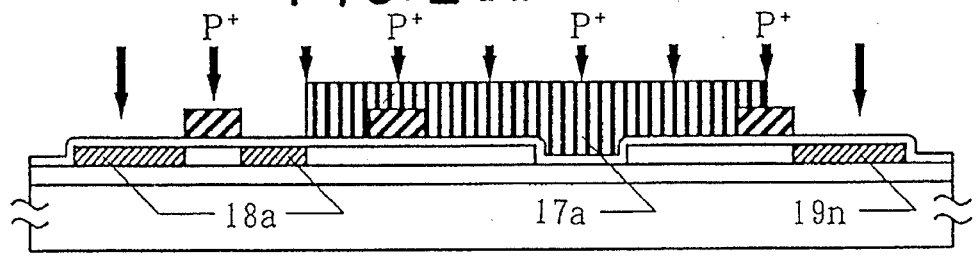

Then, as shown in FIG. 2B, a photoresist mask 17a was formed and impurities (phosphorus) were implanted into the silicon region by plasma doping using the gate electrode as a mask. Doping was conducted by using phosphine ($PH_3$3) as a doping gas at an acceleration voltage of 60 to 90 kV, for example, 80 kV. The amount of dose was $1 \times 10^{15}$ to $8 \times 10^{15}$ cm$^{-2}$, for example, $2 \times 10^{15}$ cm$^{-2}$. As a result, an N-type impurity region 18a for TFT and an N-type impurity region 19n for TFD were formed (FIG. 2B).

Figure 2C:
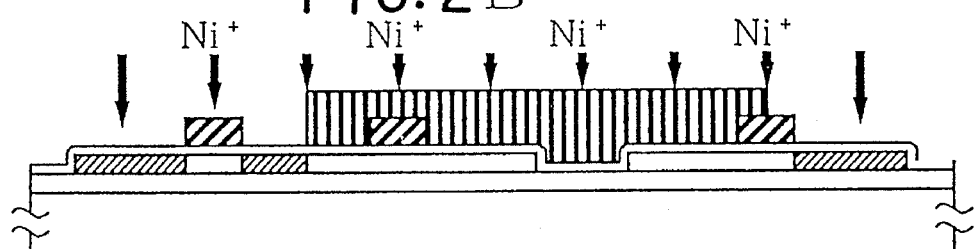

Further, as shown in FIG. 2C, nickel ions were implanted by an ion implantation method while leaving the photoresist mask 17a as it was. The amount of dose was $1 \times 10^{13}$ to $5 \times 10^{14}$ cm$^{-2}$, for example, $5 \times 10^{13}$ cm$^{-2}$. As a result, nickel was implanted at a concentration of about $5 \times 10^{18}$ cm$^{-3}$ in the amorphous silicon film (FIG. 2C).

Figure 2D:
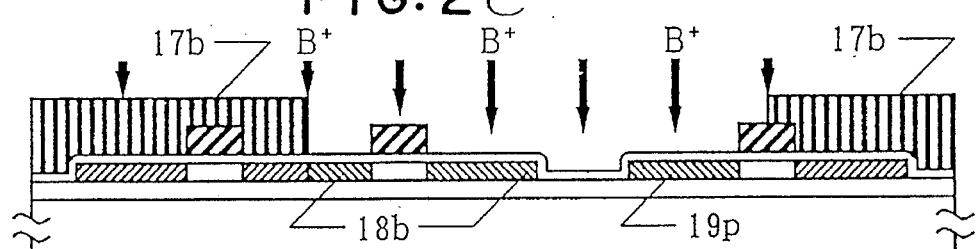

Then, as shown in FIG. 2D, a photoresist mask 17b was formed and impurities (boron) were implanted into the silicon region by plasma doping using the gate electrode as a mask. Diborane ($B_2H_6$) was used as a doping gas and the acceleration voltage was 40 to 80 KV, for example, 65 KV. The amount of dose was $1 \times 10^{15} – 8 \times 10^{15}$ cm$^{-2}$, for example $5 \times 10^{15}$ cm$^{-2}$. As a result, a P-type impurity region 18b for TFT and a p-type impurity region 19p for TFD were formed. After boron implantation, nickel was doped by using the photoresist mask 17b like that in FIG. 2C although not shown.

When the doping impurity and nickel were introduced, the impurities were not implanted in a region interposed between the N-type region and the P-type region of TFD and the region became an intrinsic region 19i (FIG. 2D).

Figure 2E:
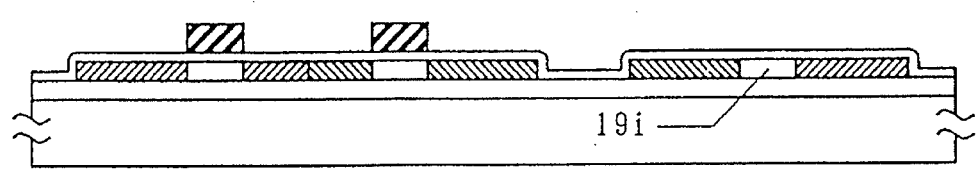
Figure 2F:
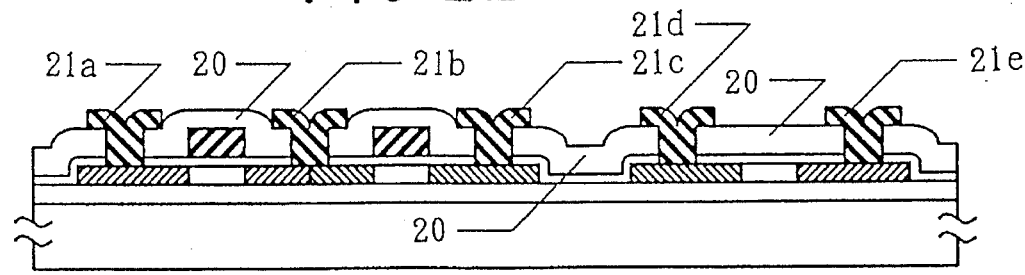

Subsequently, impurities were activated by annealing in a reducing hydrogen atmosphere at 0.1 to 1 atm at 500° C. for 4 hours. In this case, since nickel was diffused in the regions 18a, 18b and 19p and 19n to which nickel was previously implanted, crystallization proceeded easily in these regions by this annealing and the doped impurities were activated. On the other hand, silicon in the active region of TFT and the intrinsic region 19i of TFD were not crystallized since nickel was not present. After the completion of crystallization, the mask material 16c for TFD was removed (FIG. 2E).

Successively, a silicon oxide film 20 of 6,000Å thickness was formed as an interlayer insulator by plasma CVD, through which contact holes were formed and electrode/wiring 21a, 21b, 21c for TFT and electrode/wiring 21d, 21e for TFD were formed with a multi-layered film of metal material, for example, titanium or aluminum. Finally, annealing was applied in a hydrogen atmosphere at 1 atm at 350° C. for 30 min. A semiconductor circuit was completed by the steps described above.

After all, the source, drain regions for the TFT of the completed semiconductor circuit were crystalline state and the channel region (active region) for TFT of the same was amorphous state. The P-type and N-type regions for the TFD of the same were crystalline state and the intrinsic region for TFD of the same was amorphous state.

As apparent from the figures, in these steps, both of the silicon film and the interlayer insulator 20 could be a single layer. As a result, the number of film-forming steps was greatly reduced. Further, when the nickel concentration in the active region for TFT and the intrinsic region for TFD was measured by secondary ion mass spectroscopy (SIMS), both of them were less than the measuring limit ($1 \times 10^{16}$cm$^{-3}$). On the other hand, in the impurity regions for TFT and TFD, nickel at $1 \times 10^{18}$ to $5 \times 10^{18}$ cm$^{-3}$ was detected.

Example 2

FIGS. 3A–F illustrate cross sectional views for fabrication steps in Example 2 in the first feature of the present invention. On a substrate (Corning 7059) 30, were formed an underlying film 31 of silicon oxide to a thickness of 2,000Å by sputtering and, further, an amorphous silicon film by plasma CVD. Then, the amorphous silicon film was patterned to form island-like silicon regions 36a (for TFT) and 36b (for TFD). Further, a silicon oxide film 37 of 1,000Å thickness was formed as a gate insulation film by plasma CVD using tetraethoxysilane ($Si(OC_2H_5)_4$, TEOS) and oxygen as the raw material. For the starting material, trichloroethylene ($C_2HCl_3$) was used in addition to the gases described above. Before film formation, oxygen was caused to flow in a chamber at 400 SCCM and a plasma was generated at a substrate temperature of 300° C., total pressure of 5 Pa and an RF power of 150 W and this condition was kept for 10 min. Subsequently, a silicon oxide film was formed by introducing oxygen at 300 SCCM, TEOS at 15 SCCM and trichloroethylene at 2 SCCM to the chamber. The substrate temperature, the RF power and the total pressure were, respectively, 300° C., 75 W and 5 Pa. After the completion of the film formation, hydrogen at 100 Torr was introduced into the chamber and hydrogen annealing was applied at 350° C. for 35 min.

Figure 3A:
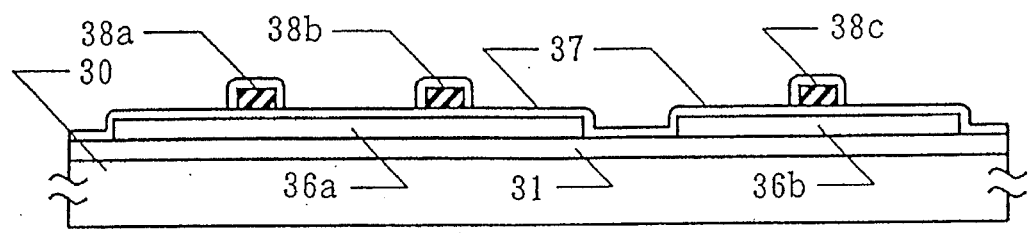
FIGS. 3A–3F are cross sectional views illustrating fabrication steps in Example 2 of the first feature of the present invention.

Successively, a tantalum film was deposited to a thickness of 6,000 to 8,000Å, for example, 6,000Å by sputtering. It is preferred that the film forming steps for the silicon oxide 37 and the tantalum film are conducted continuously. Instead of tantalum, chromium, molybdenum, tungsten, titanium or the like may also be used so long as it can endure the subsequent thermal annealing step. Then, the tantalum film was patterned to form gate electrodes 38a, 38b for TFT and a mask material 38c for TFD. Further, the surface of the tantalum wiring was anodized to form an oxide layer on the surface. Anodization was conducted in a solution of 1–5% tartaric acid in ethylene glycol. The thickness of the resultant oxide layer was 2,000Å (FIG. 3A).

Figure 3B:
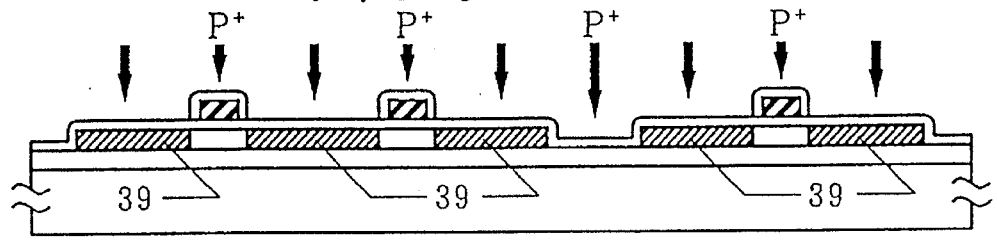

Then, impurities (phosphorus) were implanted into the silicon region by plasma doping. Phosphine ($PH_3$) was used as a doping gas and the acceleration voltage was 60 to 90 kV, for example, 80 kV. The amount of dose was $1 \times 10^{15}$ – $8 \times 10^{15}$ cm$^{-2}$, for example, $2 \times 10^{15}$ cm$^{-2}$. In this way, an N-type impurity region 39 was formed (FIG. 3B).

Figure 3C:
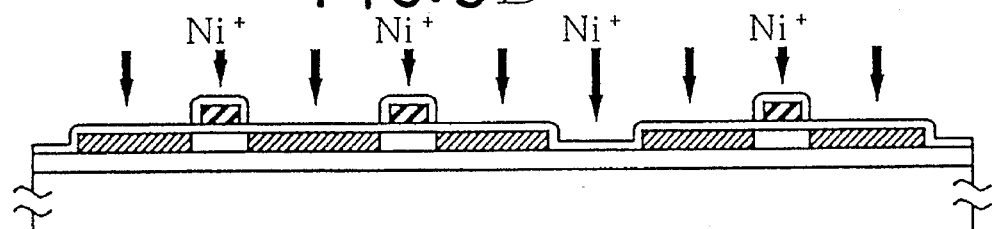
Figure 3D:
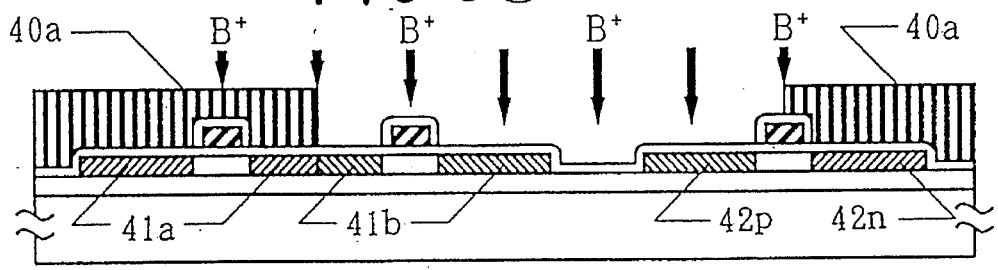

Successively, nickel ions were implanted by ion implantation. The amount of dose was $1 \times 10^{13}$ to $5 \times 10^{14}$ cm$^{-2}$, for example, $5 \times 10^{13}$ cm$^{-2}$. As a result nickel was implanted in the amorphous silicon film at a concentration of about $5 \times 10^{18}$ cm$^{-3}$ (FIG. 3C). Further, impurities (boron) were implanted again into the silicon region of TFT on the right (P-channel TFT) and the region on the left of TFD (p-type region) by plasma doping while masking the TFT on the left (N-channel TFT) and the region on the right of TFD (N-type region) with a photoresist 40a. Diborane ($B_2H_6$) was used as the doping gas and the acceleration voltage was 50–80 kV, for example, 65 kV. The amount of dose was $1 \times 10^{15}$ to $8 \times 10^{15}$ cm$^{-2}$, for example at $5 \times 10^{15}$ cm$^{-2}$ which is greater than the amount of phosphorus implanted previously. As a result, an N-type impurity region 41a, a p-type impurity region 41b for TFT and an N-type region 42n and p-type region 42p for TFD were formed (FIG. 3D.)

Figure 3E:
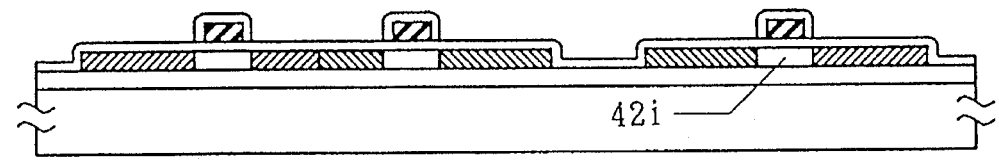
Figure 3F:
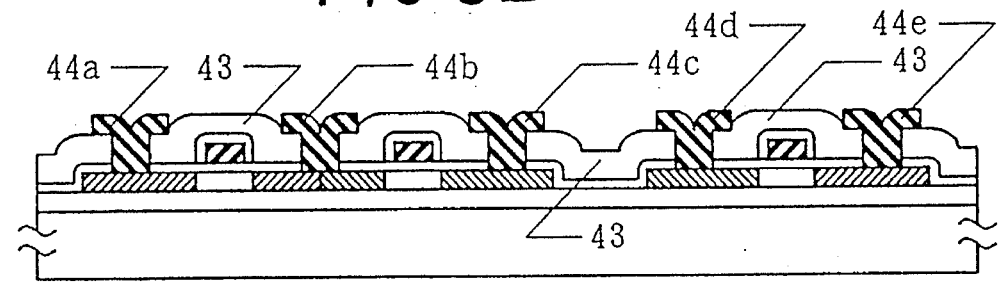

Subsequently, the impurities were activated by annealing in a reducing hydrogen atmosphere at 0.1 to 1 atm, at 500° C. for 4 hours. In this case, since nickel was diffused in the regions 41a, 41b and 42p, 42n to which nickel was implanted previously, crystallization proceeded easily in these regions at such a relatively low temperature. On the other hand, since nickel was not present in the silicon of the active region for TFT and the intrinsic region 42i for TFD, the regions were not crystallized (FIG. 3E). Successively, a silicon oxide film 43 was formed to 2,000Å thickness as an interlayer insulator by plasma CVD through which contact holes were formed and electrode/wiring 44a, 44b and 44c for TFT and electrode/wiring 44d, 44e for TFD were formed with a multi-layered film of metal material, for example, titanium nitride and aluminum. This structure is advantageous in that the titanium nitride has a good electrical contact in contact with the source and drain regions. Finally, annealing was applied in a hydrogen atmosphere at 1 atm at 350° C. for 30 min. With the steps as described above, a semiconductor circuit was completed (FIG. 3F).

After all, the source, drain regions for TFT of the completed semiconductor circuit were crystalline state and the channel region (active region) for TFT of the same was amorphous state. The P-type and N-type regions for TFD of the same were crystalline state and the intrinsic region for TFD of the same was amorphous state.

Example 3

FIGS. 4A–4E illustrate cross sectional views for fabrication steps in Example 3 in the second feature of the present invention. Identical or similar element to those in Example 2 carry the same reference numerals. On a substrate (Corning 7059) 30, were formed an underlying film 31 of silicon oxide to a thickness of 2,000Å by sputtering and, further, an amorphous silicon film by plasma CVD. Then, the amorphous silicon film was patterned to form island-like silicon regions 36a (for TFT) and 36b (for TFD). Further, a silicon oxide film 37 of 1,000Å thickness was formed as a gate insulation film by plasma CVD using tetraethoxysilane ($Si(OC_2H_5)_4$, TEOS) and oxygen as the raw material. For the starting material, trichloroethylene ($C_2HCl_3$) was used in addition to the gases described above. Before film formation, oxygen was caused to flow in a chamber at 400 SCCM and a plasma was generated at a substrate temperature of 300° C., total pressure of 5 Pa and an RF power of 150 W and this condition was kept for 10 min. Subsequently, a silicon oxide film was formed by introducing oxygen at 300 SCCM, TEOS at 15 SCCM and trichloroethylene at 2 SCCM to the chamber. The substrate temperature, the RF power and the total pressure were, respectively, 300° C., 75 W and 5 Pa. After the completion of the film formation, hydrogen at 100 Torr was introduced into the chamber and hydrogen annealing was applied at 350° C. for 35 min.

Figure 4A:
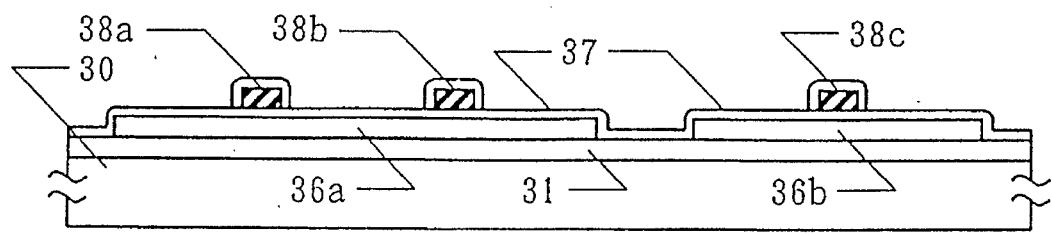
FIGS. 4A–4E are cross sectional views illustrating fabrication steps in Example 3 of the second feature of the present invention.

Successively, a tantalum film was deposited to a thickness of 6,000 to 8,000Å, for example, 6,000Å by sputtering. It is preferred that the film forming steps for the silicon oxide 37 and the tantalum film are conducted continuously. Instead of tantalum, chromium, molybdenum, tungsten, titanium or the like may also be used so long as it can endure the subsequent annealing step. Then, the tantalum film was patterned to form gate electrodes 38a, 38b for TFT and a mask material 38c for TFD. Further, the surface of the tantalum wiring was anodized to form an oxide layer on the surface. Anodization was conducted in a solution of 1–5% tartaric acid in ethylene glycol. The thickness of the resultant oxide layer was 2,000Å (FIG. 4A).

Figure 4B:
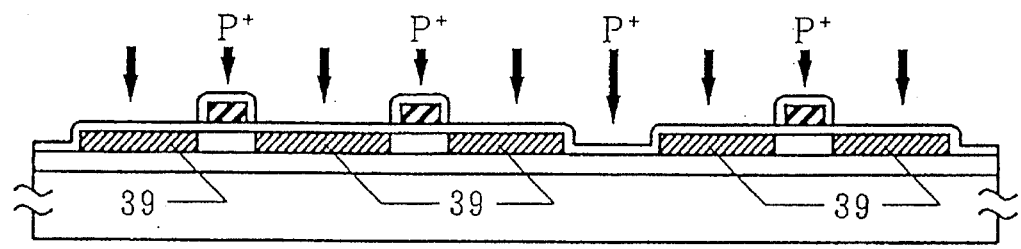

Then, impurities (phosphorus) were implanted into the silicon region by plasma doping. Phosphine ($PH_3$) was used as a doping gas and the acceleration voltage was 60 to 90 kV, for example, 80 kV. The amount of dose was $1 \times 10^{15}$ – $8 \times 10^{15}$ cm$^{-2}$, for example, $2 \times 10^{15}$ cm$^{-2}$. In this way, an N-type impurity region 39 was formed (FIG. 4B).

Figure 4C:
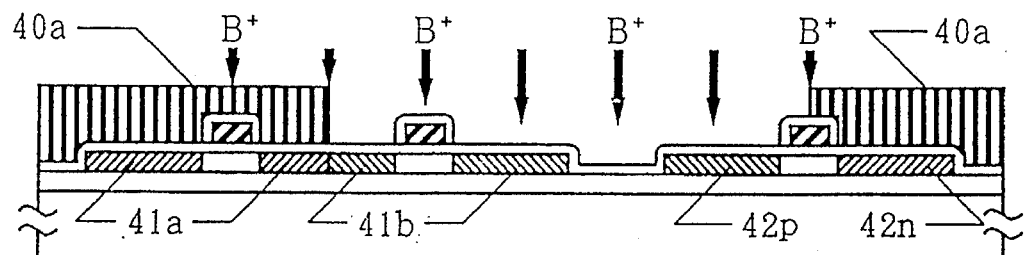

Further, impurities (boron) were implanted again into the silicon region of TFT on the right (P-channel TFT) and the region on the left of TFD (p-type region) by plasma doping while masking the TFT on the left (N-channel TFT) and the region on the right of TFD (N-type region) with a photoresist 40a. Diborane ($B_2H_6$) was used as the doping gas and the acceleration voltage was 50 to 80 kV, for example, 65 kV. The amount of dose was $1 \times 10^{15}$ to $8 \times 10^{15}$ cm$^{-2}$, for as example, at $5\times10^{15}$ cm$^{-2}$ which is greater than the amount of phosphorus implanted previously. As a result, an N-type impurity region 41a, a p-type impurity region 41b for TFT and an N-type region 42n and p-type region 42p for TFD were formed (FIG. 4C).

Figure 4D:
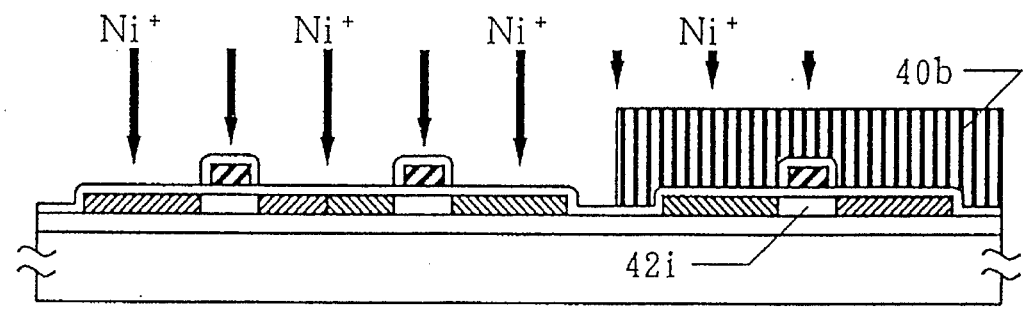

Successively, a mask 40b was formed by photoresist in the TFD region and nickel ions were implanted by ion implantation. The amount of dose was $1\times10^{13}$ to $5\times10^{14}$ cm$^{-2}$, for example, $5\times 10^{13}$cm$^{-2}$. As a result, nickel was implanted in the impurity regions 41a, 41b of TFT at a concentration of about $5\times10^{18}$ cm$^{-3}$ (FIG. 4D).

Subsequently, the impurities were activated by annealing in a reducing hydrogen atmosphere at 0.1 to 1 atm, at 500° C. for 4 hours. In this case, crystallization proceeded easily by this annealing to activate the doped impurities in the regions 41a, 41b to which nickel was implanted previously. On the other hand, since nickel was not present in the silicon region for TFD, the region was not crystallized.

Figure 4E:
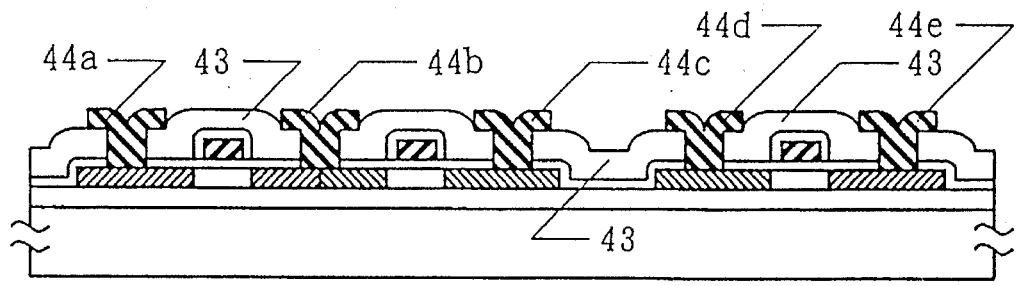

Successively, a silicon oxide film 43 was formed to a 2,000 Å thickness as an interlayer insulator by plasma CVD through which contact holes were formed and electrode/ wiring 44a, 44b, 44c for TFT and electrode/wiring 44d, 44e for TFD were formed with a multi-layered film of metal material, for example, titanium nitride and aluminum. Finally, annealing was applied in a hydrogen atmosphere at 1 atm at 350° C. for 30 min. With the steps as described above, a semiconductor circuit was completed (FIG. 4E).

After all, the source, drain regions for TFT of the completed semiconductor circuit were crystalline state and the channel region (active region) for TFT of the same was amorphous state or crystalline state due to diffused nickel from impurity region. The regions for TFD of the same were all amorphous state.

Example 4

FIGS. 5A–F illustrate cross sectional views for fabrication steps in Example 4 in the second feature of the present invention. Identical or similar elements to those in Example 2 carry the same reference numerals. On a substrate (Corning 7059) 30, an underlying film 31 of silicon oxide was formed to a thickness of 2,000Å by sputtering. Further, there were formed an amorphous silicon film 32 to a thickness of 500 to 1,500Å, for example, 500Å and a silicon oxide film 33 to a thickness of 200Å by plasma CVD. Then, the amorphous silicon film 32 was masked with a photoresist 34, and nickel ions were selectively implanted by an ion implantation method to prepare a region 35 in which nickel was contained by $1\times10^{18}$ to $2\times10^{19}$ cm$^{-3}$, for example, $5\times10^{18}$ cm$^{-3}$.

Figure 5A:
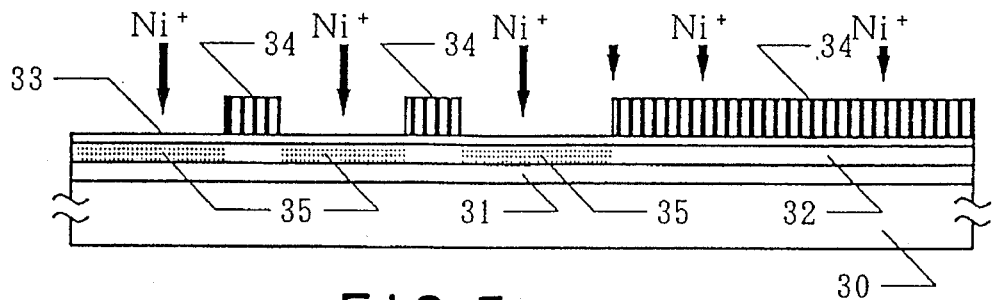
FIGS. 5A–5F are cross sectional views illustrating fabrication steps in Example 4 of the second feature of the present invention.

The thickness of the region 35 was made to 200 to 500Å, and an optimum acceleration energy was selected correspondingly. Further, nickel was not implanted in the region to form a channel-forming region in TFT and a region to fabricate TFD. The channel length of TFT was set to less than 20 μm, preferably, 10 μm, because nickel can be diffused by annealing to crystallize the channel forming region. By utilizing this effect, crystallization can be promoted while lowering the nickel concentration in the active region of TFT (FIG. 5A).

Then, the amorphous silicon film was patterned to form island-like silicon regions 36a (for TFT) and 36b (for TFD). Further, a silicon oxide film 37 of 1,000Å thickness was formed as a gate insulation film by plasma CVD using tetraethoxysilane (Si(OC$_2$H$_5$)$_4$, TEOS) and oxygen as the raw material.

For the starting material, trichloroethylene (C$_2$HCl$_3$) was used in addition to the gases described above. Before film formation, oxygen was caused to flow in a chamber at 400 SCCM and plasmas were generated at a substrate temperature of 300° C., total pressure of 5Pa and an RF power of 150 W and this condition was maintained for 10 min. Subsequently, a silicon oxide film was formed by introducing oxygen at 300 SCCM, TEOS at 15 SCCM and trichloroethylene at 2 SCCM to the chamber. The substrate temperature, the RF power and the total pressure were, respectively, 300° C., 75 W and 5 Pa. After the completion of the film formation, hydrogen at 100 Torr was introduced into the chamber and hydrogen annealing was applied at 350° C. for 35 min.

Figure 5B:
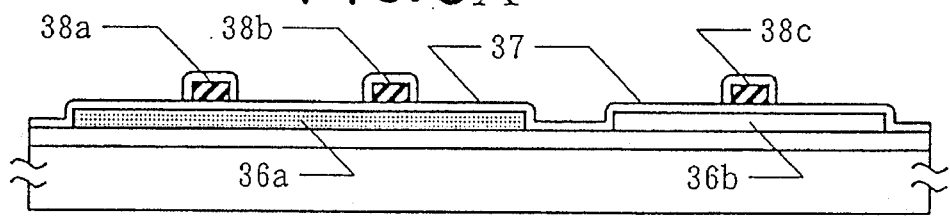

Successively, a tantalum film was deposited to a thickness of 6,000 to 8,000Å, for example, 6,000Å by sputtering. It is preferred that the film forming steps for the silicon oxide 37 and the tantalum film are conducted continuously. Instead of tantalum, chromium, molybdenum, tungsten, titanium or the like may also be used so long as it can endure the subsequent annealing step. Then, the tantalum film was patterned to form gate electrodes 38a, 38b for TFT and a mask material 38c for TFD. Further, the surface of the tantalum wiring was anodized to form an oxide layer on the surface. Anodization was conducted in a solution of 1–5% tartaric acid in ethylene glycol. The thickness of the resultant oxide layer was 2,000Å (FIG. 5B).

Figure 5C:
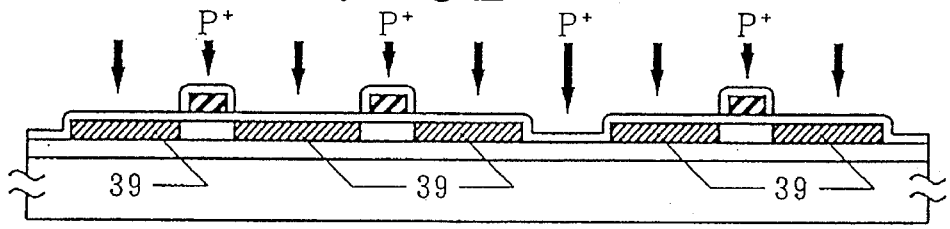

Then, impurities (phosphorus) were implanted into the silicon region by plasma doping. Phosphine (PH$_3$) was used as a doping gas and the acceleration voltage was 60 to 90 kV, for example, 80 kV. The amount of dose was $1\times10^{15}$–$8\times10^{15}$cm$^{-2}$, for example, $2\times10^{15cm-2}$. In this way, an N-type impurity region 39 was formed (FIG. 5C).

Figure 5D:
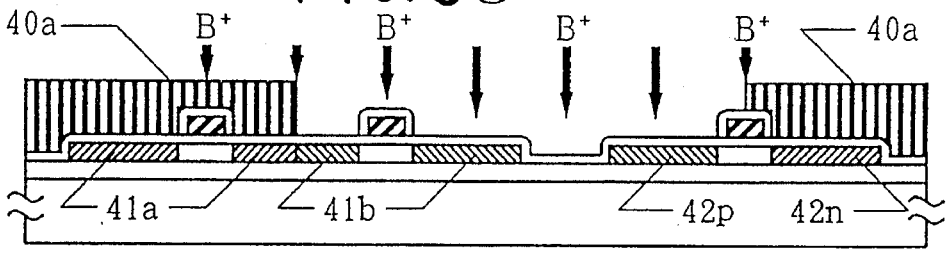

Further, impurities (boron) were implanted again into the silicon region of TFT on the right (P-channel TFT) and the region on the left of TFD (p-type region) by plasma doping while masking the TFT on the left (N-channel TFT) and the region on the right of TFD (N-type region) with a photoresist 40a. Diborane (B$_2$H$_6$) was used as the doping gas and the acceleration voltage was 50 to 80 kV, for example, 65 kV. The amount of dose was $1\times10^{15}$ to $8\times10^{15}$cm$^{-2}$, for example, at $5\times10^{15}$ cm$^{-2}$ which was greater than the amount of phosphorus implanted previously. As a result, an N-type impurity region 41a, a p-type impurity region 41b for TFT and an N-type region 42n and a p-type region 42p for TFD were formed (FIG. 5D).

Figure 5E:
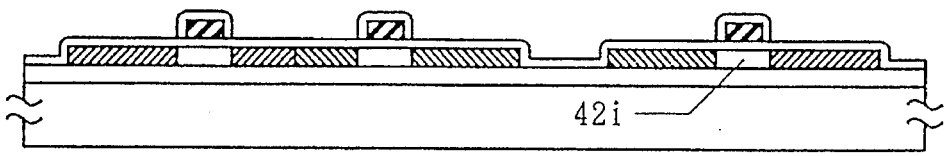

Subsequently, the impurities were activated by annealing in a reducing hydrogen atmosphere at 0.1 to 1 atm, at 500° C. for 4 hours. In this case, crystallization proceeded easily by this annealing to activate the doped impurities in the region 36a to which nickel was implanted previously. On the other hand, since nickel was not present in the silicon of the region 38b (including intrinsic region 42i) for TFD, the region was not crystallized (FIG. 5E).

Figure 5F:
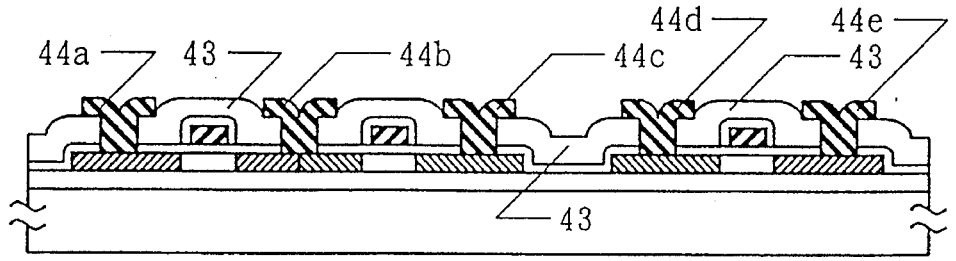

Successively, a silicon oxide film 43 was formed to a 2,000Å thickness as an interlayer insulator by plasma CVD through which contact holes were formed and electrode/ wiring 44a, 44b, 44c for TFT and electrode/wiring 44d, 44e for TFD were formed with a multi-layered film of metal material, for example, titanium nitride and aluminum. Finally, annealing was applied in a hydrogen atmosphere at 1 atm at 350° C. for 30 min. With the steps as described above, a semiconductor circuit was completed (FIG. 5F).

After all, the source, drain regions for TFT of the completed semiconductor device were crystalline state and the regions for TFD of the same were all amorphous state. Also, the channel region of the TFT could be crystallized because of the nickel diffused from the source and drain regions.

Example 5

Figure 6A:
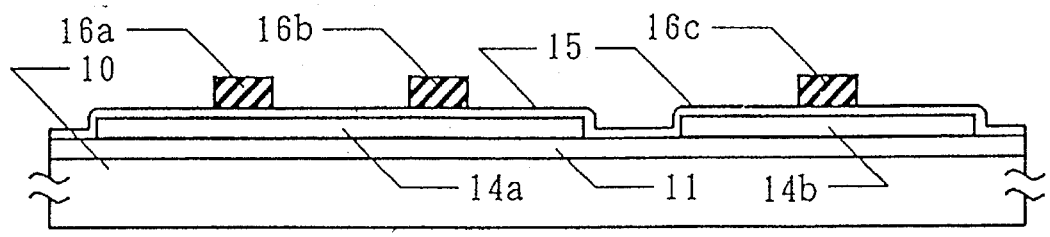
FIGS. 6A–6E are cross sectional views illustrating fabrication steps in Example 5 of the third feature of the present invention.

FIGS. 6A–E illustrates cross sectional views for fabrication steps in Example 5 of the third feature according to the present invention. Identical or similar elements to those in Example 1 carry the same reference numerals. At first, an underlying film 11 made of silicon oxide was formed to a thickness of 2,000Å by a sputtering method on a substrate (Corning 7059) 10. Further, an intrinsic (I) amorphous silicon film was deposited to a thickness of 500 to 1,500Å, for example, 1,500Å by plasma CVD. Then, the thus obtained amorphous silicon film was patterned by photolithography to form an island-like silicon regions 14a (for TFT) and 14b (for TFD). Further, a silicon oxide film 15 was deposited to a thickness of 1,000Å as a gate insulation film by a sputtering method. Sputtering was applied using silicon oxide as a target, at a substrate temperature of 200° to 400° C., for example, at 250° C. in a sputtering atmosphere of oxygen and argon at an argon/oxygen ratio of 0 to 0.5, for example, less than 0.1. Successively, a silicon film (containing 0.1 to 2% phosphorus) was deposited to a thickness of 6,000 to 8,000Å, for example, 6,000Å by vacuum CVD. The steps of forming the silicon oxide and the silicon film are desirably conducted continuously. Then, the silicon film was patterned to form gate electrodes 16a and 16b for TFT and a mask material 16c for TFT (FIG. 6A).

Figure 6B:
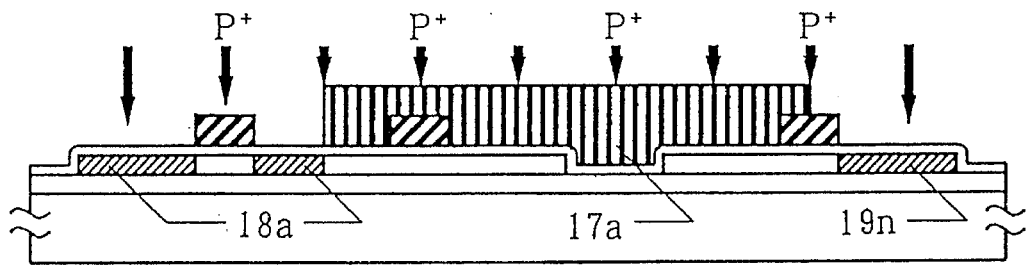

Then, as shown in FIG. 6B, a photoresist mask 17a was formed and impurities (phosphorus) were implanted into the silicon region by plasma doping using the gate electrode as a mask. Doping was conducted by using phosphine ($PH_3$) as a doping gas at an acceleration voltage of 60 to 90 kV, for example, 80 kV. The amount of dose was $1 \times 10^{15}$ to $8 \times 10^{15}$ $cm^{-2}$ for example, $2 \times 10^{15}$ $cm^{-2}$. As a result, an N-type impurity region 18a for TFT and an N-type impurity region 19n for TFD were formed (FIG. 6B).

Figure 6C:
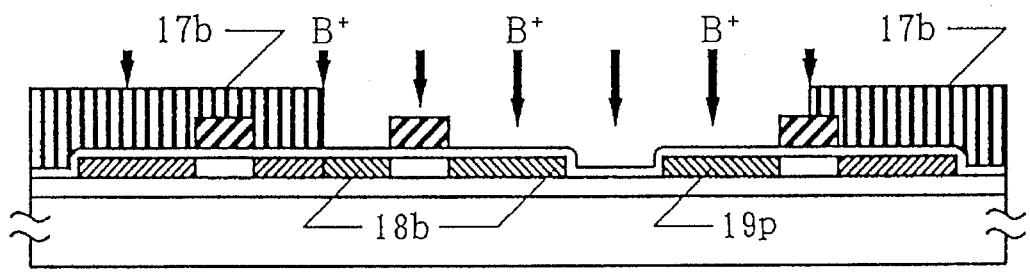

Then, as shown in FIG. 6C, a photoresist mask 17b was formed and impurities (boron) were implanted into the silicon region by plasma doping using the gate electrode as a mask. Diborane ($B_2H_6$) was used as a doping gas and the acceleration voltage was 40 to 80 KV, for example, 65 KV. The amount of dose was $1 \times 10^{15} - 8 \times 10^{15}$ $cm^{-2}$, for example, $5 \times 10^{15}$.

As a result, a p-type impurity region 18b for TFT and a p-type impurity region 19p for TFD were formed.

When the doping impurities were introduced, the impurities were not implanted in a region interposed between the N-type region and the p-type region of TFD by the mask material 16c of TFD and the region became an intrinsic region 19i. After introducing impurities, the mask material 16c for TFD was removed (FIG. 6C).

Figure 6D:
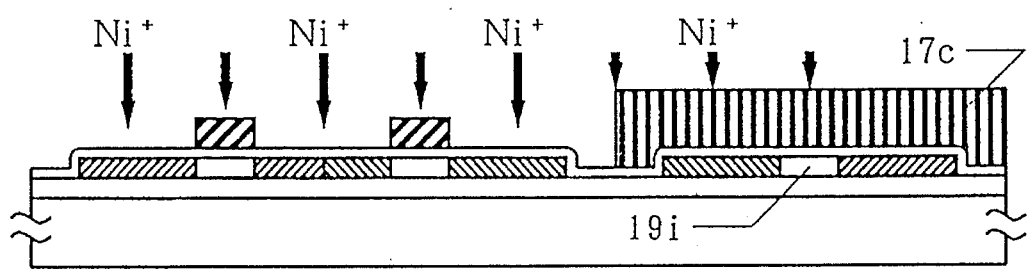
Figure 6E:
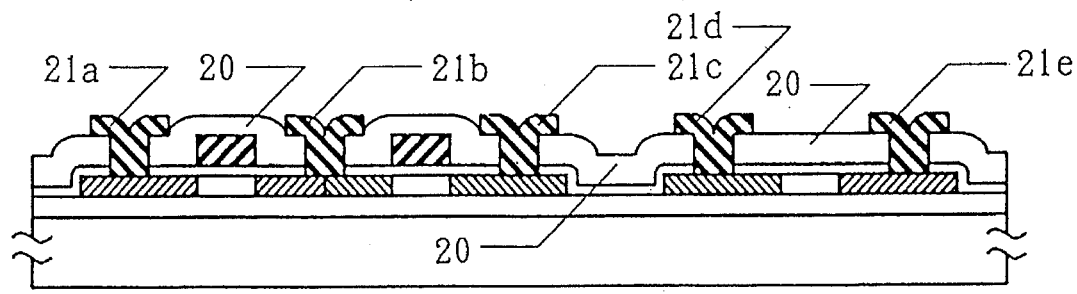

Further, as shown in FIG. 6D, a photoresist mask 17c was formed covering the TFD region and nickel ions were implanted by an ion implantation method by using this mask. The amount of dose was $1 \times 10^{13}$ to $5 \times 10^{14}$ $cm^{-2}$, for example, $5 \times 10^{13}$ $cm^{-2}$. As a result, nickel was implanted at a concentration of about $5 \times 10^{18}$ $cm^{-3}$ in the impurity regions 18a, 18b of the TFT region (FIG. 6D).

Subsequently, impurities were activated by annealing in a reducing hydrogen atmosphere at 0.1 to 1 atm at 500° C. for 4 hours. In this case, since nickel was diffused in the regions 18a, 18b to which nickel was previously implanted, crystallization proceeded easily by this annealing and the doped impurities were activated. Further, if the width of the gate electrode is less than 20 µm, preferably, less than 10 µm, nickel diffused from the impurity region to proceed crystallization as far as the active region. On the other hand, since nickel was not present in silicon region of TFD, no crystallization occurred.

Successively, a silicon oxide film 20 of 6,000Å thickness was formed as an interlayer insulator by plasma CVD, through which contact holes were formed and electrode/wiring 21a, 21b, 21c for TFT and electrode/wiring 21d, 21e for TFD were formed with a multi-layered film of metal material, for example, titanium nitride or aluminum. Finally, annealing was applied in a hydrogen atmosphere at 1 atm at 350° C. for 30 min. A semiconductor circuit was completed by the steps described above (FIG. 6E).

After all, the source, drain regions for TFT of the completed semiconductor circuit were crystalline state and TFD of the same was amorphous state.

As apparent from the figures, in these steps, both of the silicon film and the interlayer insulator 20 could be a single layer. As a result, the number of film-forming steps was greatly reduced. Further, when the nickel concentration was measured by secondary ion mass spectroscopy (–SIMS), nickel at $1 \times 10^{18} - 5 \times 10^{18}$ $cm^{-3}$ was detected in the impurity region of TFT. On the other hand, in the region for TFD, it was less than the measuring limit ($1 \times 10^{16} cm^{-3}$).

Example 6

Figure 7A:
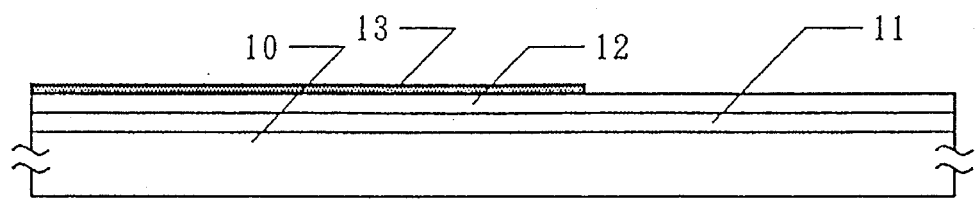
FIGS. 7A–7F are cross sectional views illustrating fabrication steps in Example 6 of the third feature of the present invention.

FIGS. 7A–E illustrates cross sectional views for fabrication steps in Example 6 of the third feature according to the present invention. Identical or similar elements to those in Example 1 carry the same reference numerals. At first, an underlying film 11 made of silicon oxide was formed to a thickness of 2,000Å by a sputtering method on a substrate (Corning 7059) 10. Further, an intrinsic (I) amorphous silicon film 12 was deposited to a thickness of 500 to 1,500Å, for example, 1,500Å by plasma CVD. Successively, a nickel silicide film 13 ($NiSi_x$, $0.4 \leq x \leq 2.5$, for example, $x=2.0$) was selectively formed by sputtering to a thickness of 5 to 200Å, for example, 20Å as shown in the drawing (FIG. 7A).

Then, the film was crystallized by annealing in a reducing hydrogen atmosphere (preferably, 0.1–1 atm of hydrogen partial pressure), at 500° C. for 4 hours. As a result, the amorphous silicon film below the nickel silicide film 13 was crystallized into a crystalline silicon film. On the other hand, the silicon film in the region in which the nickel silicide film was not present remained in the amorphous state as it was.

Figure 7B:
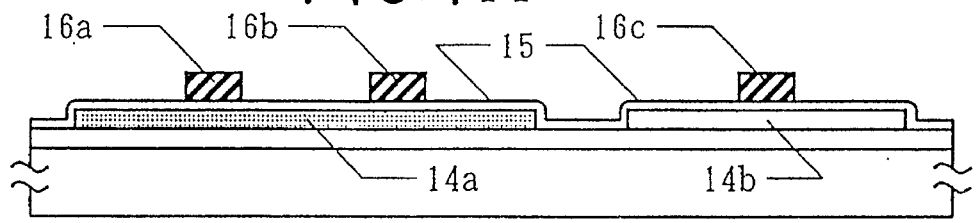

Then, the thus obtained amorphous silicon film was patterned by photolithography to form an island-like silicon regions 14a (for TFT) and 14b (for TFD). While the region 14a was crystallized in the previous annealing step, the region 14b remained amorphous as it was. Further, a silicon oxide film 15 was deposited to a thickness of 1,000Å as a gate insulation film by sputtering. Sputtering was applied using silicon oxide as a target, at a substrate temperature of 200° to 400° C., for example, at 300° C. in a sputtering atmosphere of oxygen and argon at an argon/oxygen ratio of 0 to 0.5, for example, less than 0.1. Successively, a silicon film (containing 0.1 to 2% phosphorus) was deposited to a thickness of 6,000 to 8,000Å, for example, 6,000Å by vacuum CVD. The steps of forming the silicon oxide and the silicon film are desirably conducted continuously. Then, the silicon film was patterned to form gate electrodes 16a and 16b for TFT and a mask material 16c for TFD (FIG. 7B).

Figure 7C:
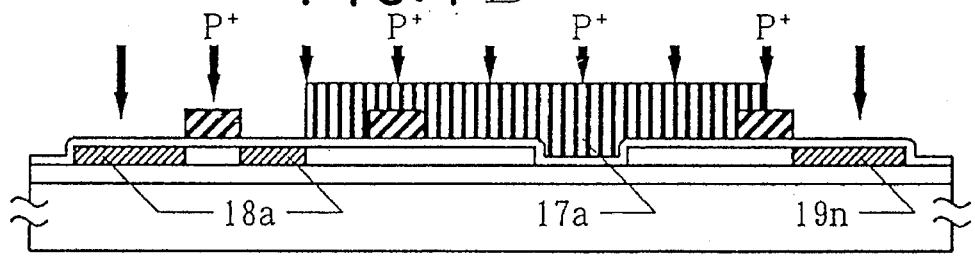

Then, as shown in FIG. 7C, a photoresist mask 17a was formed and impurities (phosphorus) were implanted into the silicon region by plasma doping using the gate electrode as a mask. Doping was conducted by using phosphine (PH$_3$) as a doping gas at an acceleration voltage of 60 to 90 kV, for example, 80 kV. The amount of dose was $1\times10^{15}$ to $8\times10^{15}$ cm$^{-2}$, for example, $2\times10^{15}$ cm$^{-2}$. As a result, an N-type impurity region 18a for TFT and an N-type impurity region 19n for TFD were formed (FIG. 7C).

Figure 7D:
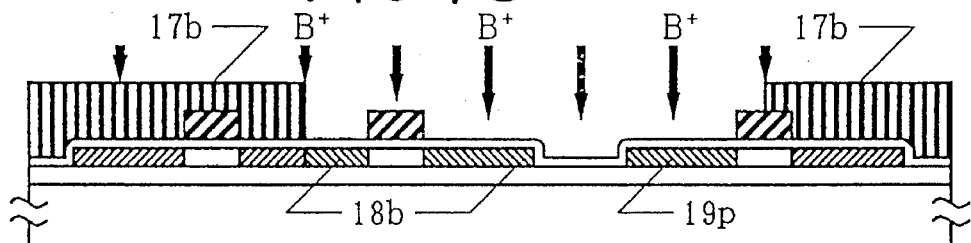

Then, as shown in FIG. 7D, a photoresist mask 17b was formed and impurities (boron) were implanted into the silicon region by plasma doping using the gate electrode as a mask. Diborane (B$_2$H$_6$) was used as a doping gas and the acceleration voltage was 40 to 80 KV, for example, 65 KV. The amount of dose was $1\times10^{15}$ to $8\times10^{15}$ cm$^{-2}$, for example, $5\times10^{15}$ cm$^{-2}$. As a result a P-type impurity region 18b for TFT and a P-type impurity region 19p for TFD were formed.

When the doping impurities were introduced, the impurities were not implanted in a region interposed between the n-type region and the p-type region of TFD by the mask 16c of TFD and the region became an intrinsic region 19i (FIG. 7D).

Figure 7E:
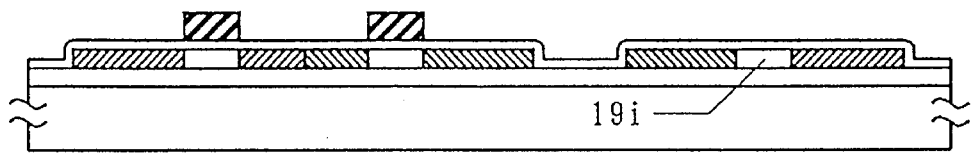

Subsequently, impurities were activated by annealing in a reducing hydrogen atmosphere at 0.1 to 1 atm at 500° C. for 4 hours. In this case, since nickel was diffused in the regions 14a of TFT to which nickel was previously implanted, crystallization proceeded easily by this annealing and the doped impurities were activated. On the other hand, the region 14b for TFD was not crystallized since nickel was not present. After the completion of annealing, the mask material 16c for TFD was removed (FIG. 7E).

Figure 7F:
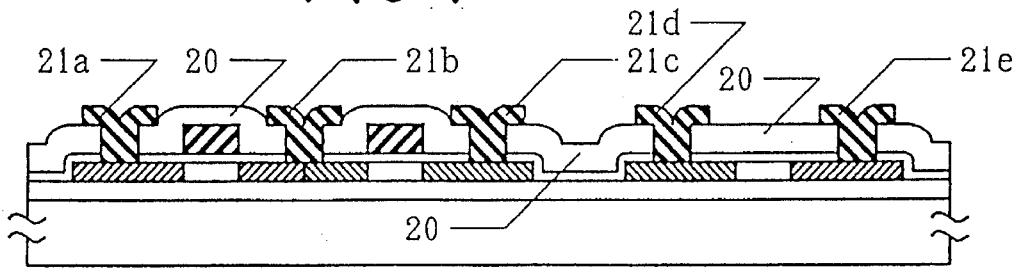

Successively, a silicon oxide film 20 of 6,000Å thickness was formed as an interlayer insulator by plasma CVD, through which contact holes were formed and electrode/wiring 21a, 21b, 21c for TFT and electrode/wiring 21d, 21e for TFD were formed with a multi-layered film of metal material, for example, titanium nitride and aluminum. Finally, annealing was applied in a hydrogen atmosphere at 1 atm at 350° C. for 30 min. A semiconductor circuit was completed by the steps described above (FIG. 7F).

After all, the regions for TFT of the completed semiconductor circuit were all crystalline state and the regions for TFD were all amorphous state.

As apparent from the figures, in these steps, both of the silicon film 12 and the interlayer insulator 20 could be a single layer. As a result, the number of film-forming steps was greatly reduced. Further, when the nickel concentration was measured by secondary ion mass spectroscopy (SIMS), nickel at $1\times10^{18}$ to $5\times10^{18}$ cm$^{-3}$ was detected in the region 14a for TFT. On the other hand, it was less than the measuring limit ($1\times10^{16}$ cm$^{-3}$) in the region 14b for TFD.

Example 7

Figure 8A:
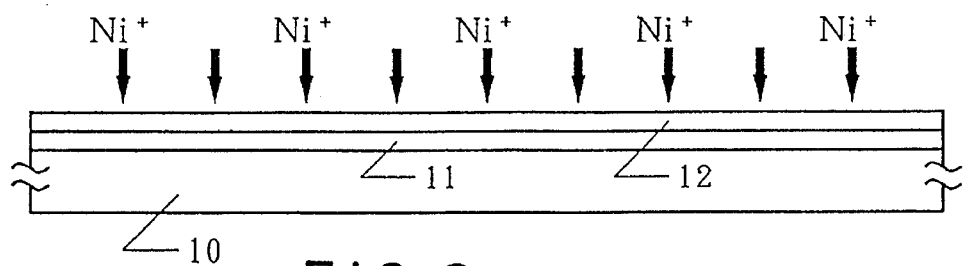
FIGS. 8A–8F are cross sectional views illustrating fabrication steps in Example 7 of the fourth feature of the present invention.

FIGS. 8A–F illustrate cross sectional views for fabrication steps in Example 7 of the fourth feature according to the present invention. Identical or similar elements to those in Example 1 carry the same reference numerals. At first, an underlying film 11 made of silicon oxide was formed to a thickness of 2,000Å by a sputtering method on a substrate (Corning 7059) 10. Further, an intrinsic (I) amorphous silicon film 12 was deposited to a thickness of 500 to 1,500Å, for example, 1,500Å by a plasma CVD process. Then, nickel ions were implanted to the thus obtained amorphous silicon film by an ion implantation method. The amount of dose was $1\times10^{13}$ to $5\times10^{14}$ cm$^{-2}$, for example, $5\times10^{13}$ cm$^{-2}$. As a result, nickel was implanted at a concentration of about $5\times10^{18}$ cm$^{-3}$ in the amorphous silicon film (FIG. 8A).

Figure 8B:
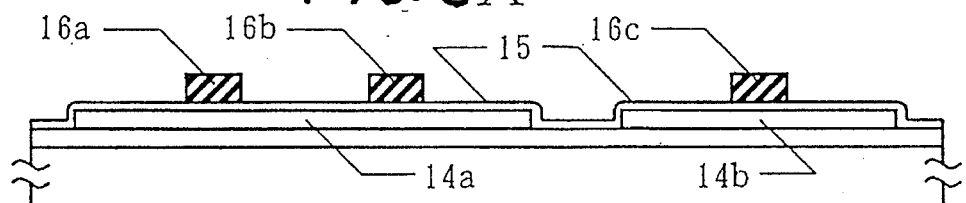

Then, patterning was applied by photolithography to form an island-like silicon regions 14a (for TFT) and 14b (for TFD). Further, a silicon oxide film 15 was deposited to a thickness of 1,000Å as a gate insulation film by a sputtering method. Sputtering was applied using silicon oxide as a target, at a substrate temperature of 200° to 400° C., for example, at 250° C. in a sputtering atmosphere of oxygen and argon at an argon/oxygen ratio of 0 to 0.5, for example, less than 0.1. Successively, a silicon film (containing 0.1 to 2% phosphorus) was deposited to a thickness of 6,000 to 8,000Å, for example, 6,000Å by vacuum CVD. The steps of forming the silicon oxide and the silicon film are desirably conducted continuously. Then, the silicon film was patterned to form gate electrodes 16a and 16b for TFT and a mask material 16c for TFD (FIG. 8B).

Figure 8C:
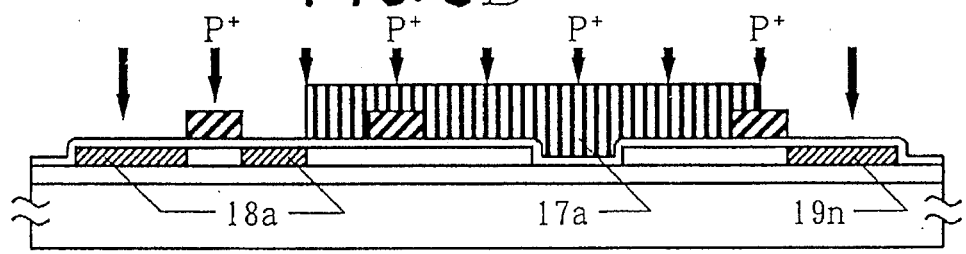

Then, as shown in FIG. 8C, a photoresist mask 17a was formed and impurities (phosphorus) were implanted into the silicon region by plasma doping using the gate electrode as a mask. Doping was conducted by using phosphine (PH$_3$) as a doping gas at an acceleration voltage of 60 to 90 kV, for example, 80 kV. The amount of dose was $1\times10^{15}$ to $8\times10^{15}$ cm$^{-2}$, for example, $2\times10^{15}$ cm$^{-2}$. As a result, an N-type impurity region 18a for TFT and an N-type impurity region 19n for TFD were formed (FIG. 8C).

Figure 8D:
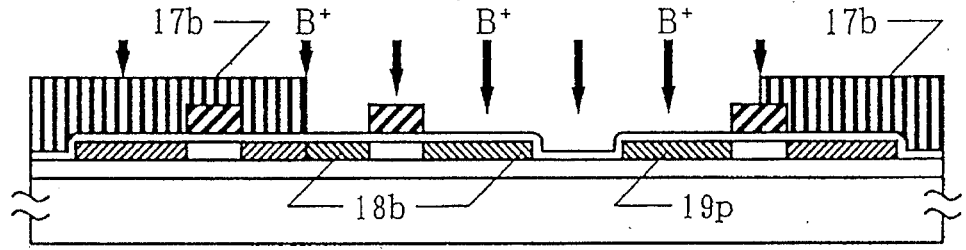

Then, as shown in FIG. 8D, a photoresist mask 17b was formed and impurities (boron) were implanted into the silicon region by plasma doping using the gate electrode as a mask. Diborane (B$_2$H$_6$) was used as a doping gas and the acceleration voltage was 40 to 80 KV, for example, 65 KV. The amount of dose was $1\times10^{15}$ to $8\times10^{15}$ cm$^{-2}$, for example, $5\times10^{15}$ cm$^{-2}$. As a result, a P-type impurity region 18b for TFT and a P-type impurity region 19p for TFD were formed. An intrinsic region 19i was left between the n-type region 19n and the p-type region 19p of TFD (FIG. 8D).

Figure 8E:
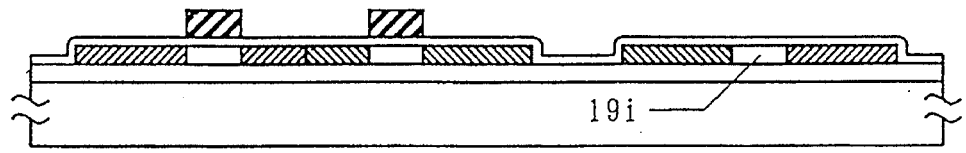
Figure 8F:
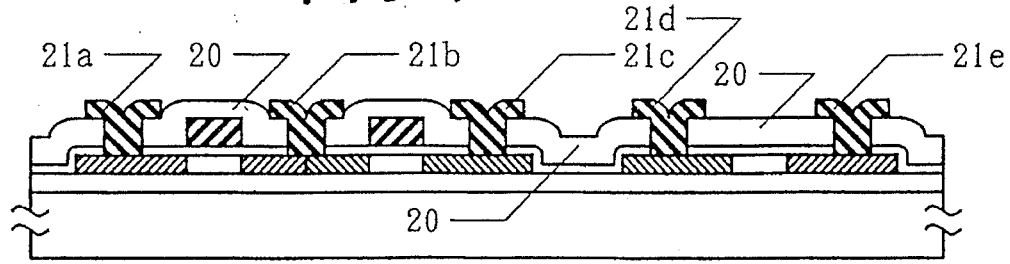

Subsequently, impurities were activated by annealing in a reducing atmosphere at 500° C. or 4 hours. In this case, crystallization proceeded easily by this annealing and the doped impurities were activated. After the completion of crystallization, the mask material 16c for TFD was removed (FIG. 8E).

Successively, a silicon oxide film 20 of 6,000Å thickness was formed as an interlayer insulator by plasma CVD, through which contact holes were formed and electrode/wiring 21a, 21b, 21c for TFT and electrode/wiring 21d, 21e for TFD were formed with a multi-layered film of metal material, for example, titanium nitride and aluminum. Finally, annealing was applied in a hydrogen atmosphere at 1 atm at 350° C. for 30 min. A semiconductor circuit was completed by the steps described above (FIG. 8F).

After all, the regions for TFT and TFD of the completed semiconductor circuit were crystalline state.

As apparent from the figures, in these steps, both of the silicon film 12 and the interlayer insulator 20 could be a single layer. As a result, the number of film-forming steps was greatly reduced. Further, when the nickel concentration in the active region of TFT and the intrinsic region of TFD was measured by secondary ion mass spectroscopy (SIMS), nickel at $1\times10^{18}$ to $5\times10^{18}$ cm$^{-3}$ was detected in both of the cases.

Figure 9A:
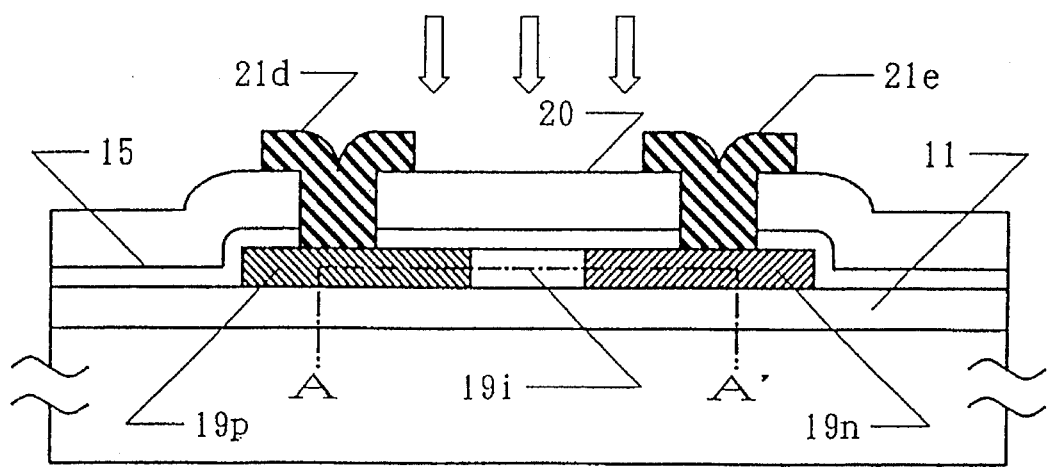
FIG. 9A is a cross sectional view of a TFD obtained in the previous example.
Figure 9B:
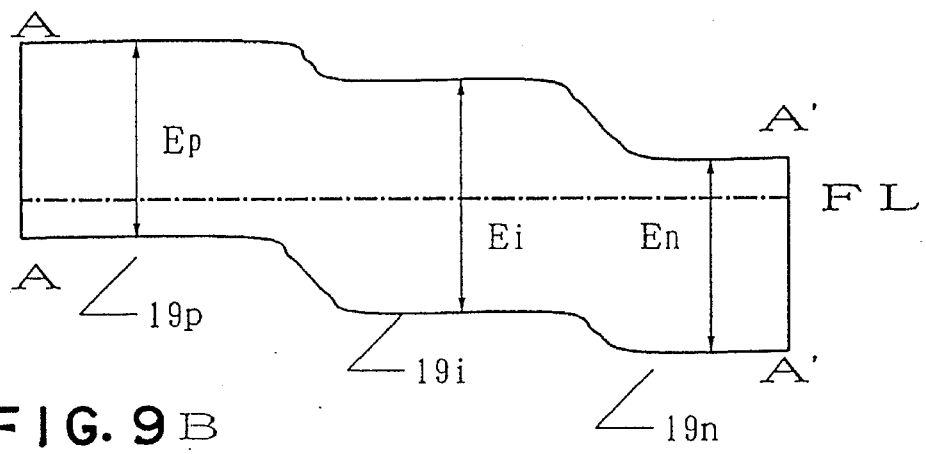
FIG. 9B is a band diagram of the TFD.

FIG. 9A shows a portion of a semiconductor layer of the TFD in the semiconductor circuits of Examples 1, 5, 6 and 7. When TFD is used as a light sensor, light enters from above through the passivation film 20. FIG. 9B shows an energy band diagram along line A—A' of TFD.

In the case that the p-type region 19p and the n-type region 19n are crystalline silicon, while the intrinsic region 19i is amorphous silicon (for example Examples 1 or 2), band gaps for the p-type region and the n-type region (Ep, En) are smaller than the band gap Ei for the intrinsic region 19i and, therefore, i-n junction of the conduction band and the p-i junction of the valance band are abrupt and the electron-hole pairs caused by irradiation of light are separated rapidly. As a result, photoelectric conversion efficiency is increased.

Figure 9C:
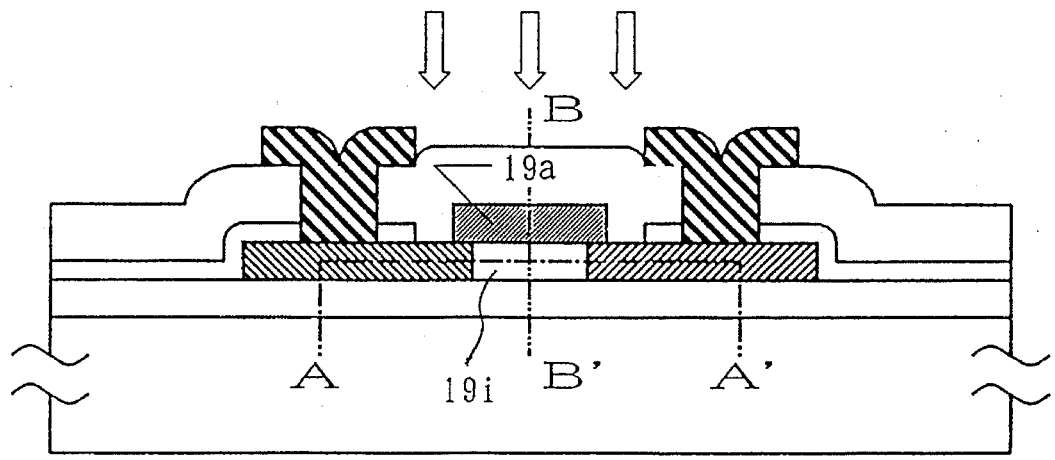
FIG. 9C is a cross sectional view illustrating a modified embodiment of the TFD.

Also, in the case that the intrinsic layer of a TFD is formed of a crystalline silicon (for example Example 7), the photosensitivity of crystalline silicon is generally low, and this may be improved, as shown in FIG. 9C, by removing the mask 16c of the TFD and then forming a semiconductor film 19a of a high photosensitivity such as hydrogenated amorphous silicon at a thickness of 1,000 to 8,000Å, for example, 3,000Å in an intimate contact with the intrinsic region 19i. Since the light absorption efficient is greater than that of the intrinsic region 19i of crystalline silicon situated below, a great amount of carriers are generated by the irradiation of light from above in the amorphous silicon film 19a, which are then drifted to the intrinsic region 19i of the crystalline silicon and then separated by an electric field applied there.

In the constitution shown in FIG. 9C, carriers are generated in the amorphous semiconductor film 19a and, at the same time, carriers are generated also in the crystalline silicon semiconductor film 19i in accordance with the dependence of the light sensitivity on the wavelength. Accordingly, it is possible to convert a light in a wider wavelength region into electricity. In a case of using an amorphous silicon film as the amorphous semiconductor film 19a, carbon, nitrogen, oxygen or the like may be added thereto for changing the dependence of the light sensitivity on the wavelength.

If the energy band width of the amorphous semiconductor film 19a is broader as compared with that of the intrinsic region 19i, the carriers generated in the intrinsic region 19i are prevented from drifting to the amorphous semiconductor film 19a, and the carriers generated in the amorphous semiconductor film 19a move along the slope of the energy band to the intrinsic region 19i. Accordingly, the generated carriers can be taken out externally more efficiently.

Example 8

FIGS. 10A–F illustrate cross sectional views for fabrication steps in Example 8 of the fourth feature of the present invention. Identical or similar elements to those in Example 2 carry the same reference numerals. On a substrate (Corning 7059) 30, were formed an underlying film 31 of silicon oxide to a thickness of 2,000Å by sputtering and, further, an amorphous silicon film by plasma CVD. Then, the amorphous silicon film was patterned to form island-like silicon regions 36a (for TFT) and 36b (for TFD). Further, a silicon oxide film 37 of 1,000Å thickness was formed as a gate insulation film by plasma CVD using tetraethoxysilane (Si(OC$_2$H$_5$)$_4$, TEOS) and oxygen as the raw material. For the starting material, trichloroethylene (C$_2$HCl$_3$) was used in addition to the gases described above. Before film formation, oxygen was caused to flow in a chamber at 400 SCCM and a plasma was generated at a substrate temperature of 300° C., total pressure of 5 Pa and an RF power of 150 W and this condition was maintained for 10 min. Subsequently, a silicon oxide film was formed by introducing oxygen at 300 SCCM, TEOS at 15 SCCM and trichloroethylene at 2 SCCM to the chamber. The substrate temperature, the RF power and the total pressure were, respectively, 300° C., 75 W and 5 Pa. After the completion of the film formation, hydrogen at 100 Torr was introduced into the chamber and hydrogen annealing was applied at 350° C. for 35 min.

Figure 10A:
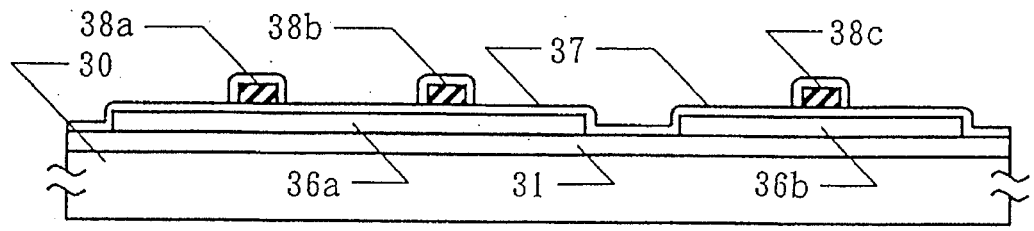
FIGS. 10A–10F are cross sectional views illustrating fabrication steps in Example 8 of the fourth feature of the present invention.

Successively, a tantalum film was deposited to a thickness of 6,000 to 8,000Å, for example, 6,000Å by sputtering. It is preferred that the film forming steps for the silicon oxide 37 and the tantalum film are conducted continuously. Instead of tantalum, chromium, molybdenum, tungsten, titanium or the like may also be used so long as it can endure the subsequent annealing step. Then, the tantalum film was patterned to form gate electrodes 38a, 38b for TFT and a mask material 38c for TFD. In this instance, the width of the gate electrode (= channel length) of TFT was made 5 to 10 μm and the width of the mask material of TFD was made 20 to 50 μm. Further, the surface of the tantalum wiring was anodized to form an oxide layer on the surface. Anodization was conducted in a solution of 1–5% tartaric acid in ethylene glycol. The thickness of the resultant oxide layer was 2,000Å (FIG. 10A).

Figure 10B:
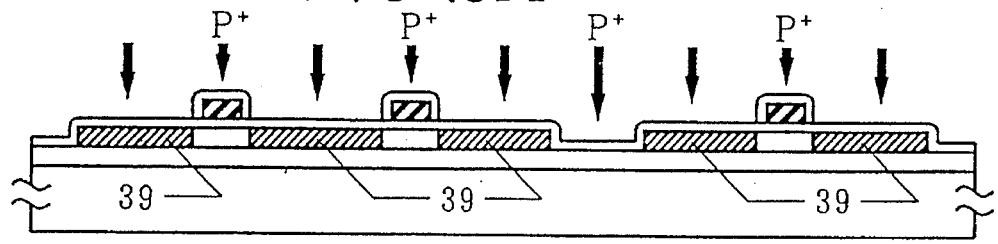

Then, impurities (phosphorus) were implanted into the silicon region by plasma doping. Phosphine (PH$_3$) was used as a doping gas and the acceleration voltage was 60 to 90 kV, for example, 80 kV. The amount of dose was $1\times10^{15}$–$8\times10^{15}$ cm$^{-2}$, for example, $2\times10^{15}$cm$^{-2}$. In this way, an N-type impurity region 39 was formed (FIG. 10B).

Figure 10C:
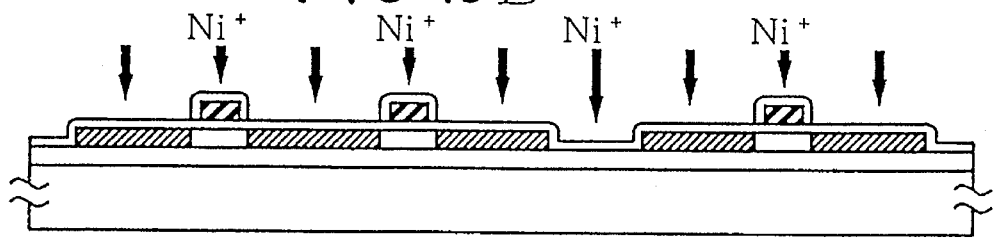

Successively, nickel ions were implanted by ion implantation. The amount of dose was $1\times10^{13}$ to $5\times10^{14}$ cm$^{-2}$, for example, $5\times10^{13}$cm$^{-2}$. As a result, nickel was implanted in the amorphous silicon film for both of the TFTs and TFD at a concentration of about $5\times10^{18}$cm$^{-3}$3 (FIG. 10C).

Figure 10D:
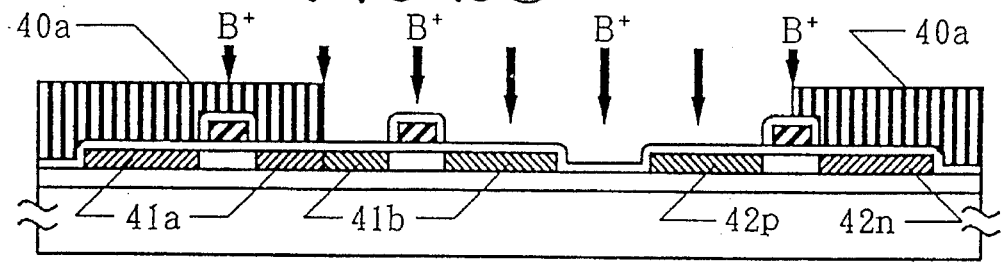
Figure 10E:
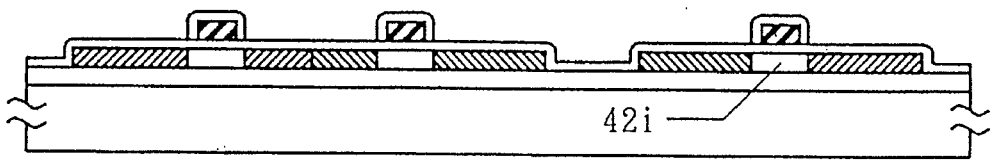

Further, impurities (boron) were implanted again into the source and drain regions of the P-channel TFT (right side) and the left region of the TFD by plasma doping while masking the N-channel TFT (left side) and the right region of the TFD with a photoresist 40a. Diborane (B$_2$H$_6$) was used as the doping gas and the acceleration voltage was 50 to 80 kV, for example, 65 kV. The amount of dose was $1\times10^{15}$ to $8\times10^{15}$cm-2, for example, at $5\times10^{15}$ cm$^{-2}$ which was greater than the amount of phosphorus implanted previously. As a result, an N-type impurity region 41a, a P-type impurity region 41b for TFT and an n-type region 42n and p-type region 42p for TFD were formed (FIG. 10D).

Figure 10F:
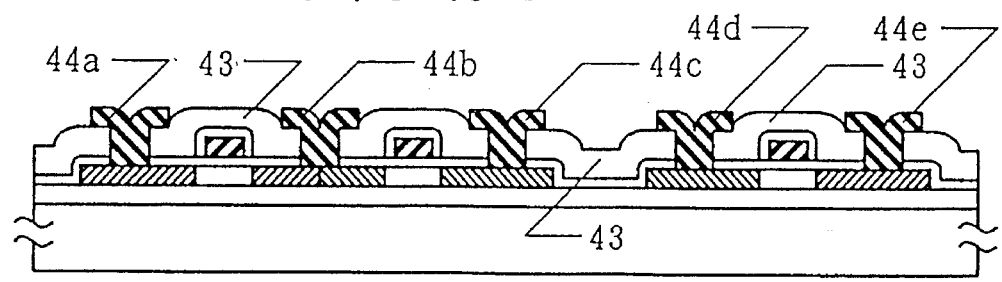

Subsequently, the impurities were activated by annealing in a reducing hydrogen atmosphere at 0.1 to 1 atm, at 500° C. for 4 hours. In this case, since nickel was diffused in the regions 41a, 41b and 42p, 42n to which nickel was implanted previously, crystallization proceeded easily by this annealing to activate the doped impurities. Nickel was diffused also in the active region for TFT to proceed crystallization. On the other hand, since nickel was not present in silicon, particularly, in a central portion of the intrinsic region 42i of TFD, and there was no diffusion from the periphery thereof, crystallization did not occur. That is, TFT was crystallized over the entire area, while TFD was crystallized in the impurity region and a portion of intrinsic region in contact with the impurity region, whereas the central portion of the intrinsic region 42i remained amorphous (FIG. 10F).

Successively, a silicon oxide film 43 was formed to 2,000Å thickness as an interlayer insulator by plasma CVD through which contact holes were formed and electrode/wiring 44a, 44b, 44c for TFT and electrode/wiring 44d, 44e for TFD were formed with a multi-layered film of metal material, for example, titanium nitride and aluminum.

Finally, annealing was applied in a hydrogen atmosphere at 1 atm at 350° C. for 30 min. With the steps as described above, a semiconductor circuit was completed (FIG. 10F).

In the previous Examples 2, 3, 4 and 8, the mask material 38c of TFD is insulated from other gate electrode wirings and put to a floated potential state. However, in this case, TFD operation may sometimes be hindered by accumulation of some or other electric charges. If stable operation is required, it is preferred to put the mask at the same potential as that for the p-type region or the n-type region of TFD. Further, since the mask material 38c is present on the intrinsic region 42i in these examples, it is necessary to enter light on the side of the substrate when TFD is used as a light sensor. In Examples 2, 3, 4 and 8, it is difficult to bring the amorphous semiconductor film into intimate contact with the intrinsic region in order to improve the light sensitivity as in FIG. 9C shown as modified embodiments of Examples 1, 5, 6 and 7. However, different from Example 7, since an amorphous state portion having satisfactory light sensitivity is left in the intrinsic region 42i, there is no substantial problem.

Although certain preferred embodiments have been shown and described, it should be understood that many changes and modifications may be made therein without departing from the scope of the appended claims. For example, although the channel forming region of the TFT in the examples of the present invention was taught to be intrinsic, the "intrinsic" in the present invention may include "N–" or "P–" type conductivity. Similarly, although the examples show only a PIN junction for the TFD, PP$^-$N, PN$^-$N junctions or the like may also be used.

What is claimed is:

1. A method of manufacturing a semiconductor circuit comprising:

a first step of forming a semiconductor film substantially in an amorphous state on a substrate, a second step of forming an insulation film, a gate electrode of a thin film transistor and a mask material for a thin film diode on said amorphous semiconductor film, wherein said thin film transistor and said thin film diode is formed from said amorphous semiconductor film, a third step of adding a catalyst element for promoting crystallization and a doping impurity to the amorphous semiconductor film using said gate electrode and said mask material as a mask, wherein said catalyst element is added only to areas of said amorphous semiconductor film in which said doping impurity is added and a fourth step of activating the introduced impurity by applying heat annealing to said semiconductor film.

2. A method of manufacturing a semiconductor circuit as defined in claim 1, wherein the annealing is applied in a hydrogen atmosphere.

3. A method of manufacturing a semiconductor circuit as defined in claim 1, wherein the mask material for the thin film diode is left after formation of the semiconductor circuit.

4. A method of manufacturing a semiconductor circuit comprising:

a first step of forming a semiconductor film substantially in an amorphous state on a substrate, a second step of forming an insulation film, a gate electrode of a thin film transistor and a mask material for a thin film diode on said amorphous semiconductor film, wherein said thin film transistor and said thin film diode is formed from said amorphous semiconductor film, a third step of adding a doping impurity to the amorphous semiconductor film and a catalyst element for promoting crystallization regarding the amorphous semiconductor film that forms the thin film transistor using said gate electrode and said mask material as a mask respectively, wherein said catalyst element is added only to areas of said amorphous semiconductor film in which said doping impurity is added, and a fourth step of activating the introduced impurity by applying heat annealing to said semiconductor film.

5. A method of manufacturing a semiconductor circuit as defined in claim 4, wherein the annealing is applied in a hydrogen atmosphere.

6. A method of manufacturing a semiconductor circuit as defined in claim 4, wherein the mask material for the thin film diode is left after the formation of the semiconductor circuit.

7. A method of manufacturing a semiconductor circuit comprising:

a first step of forming a substantially amorphous semiconductor film on a substrate, a second step of introducing a catalyst element for promoting crystallization of amorphous semiconductor selectively to a region of said amorphous semiconductor film to form a thin film transistor at a concentration of $1 \times 10^{17}$ to $2 \times 10^{20}$ atoms/cm$^3$, a third step of forming an insulation film, a gate electrode of the thin film transistor and a mask material for a thin film diode on said amorphous semiconductor film, a fourth step of adding a doping impurity to the amorphous semiconductor film using said gate electrode and said mask material as a mask and a fifth step of activating introduced impurity by applying heat annealing to said semiconductor film.

8. A method of manufacturing a semiconductor circuit as defined in claim 7, wherein the annealing is applied in a hydrogen atmosphere.

9. A method of manufacturing a semiconductor circuit as defined in claim 7, wherein the mask material for the thin film diode is left after formation of the semiconductor circuit.

10. A method of manufacturing a semiconductor circuit comprising:

a first step of forming a semiconductor film substantially in an amorphous state on a substrate, a second step of introducing a catalyst element for promoting crystallization to said semiconductor film at a concentration of $1 \times 10^{17}$ to $2 \times 10^{20}$ atoms/cm$^3$, a third step of forming an insulation film, a gate electrode of a thin film transistor and a mask material for a thin film diode on said semiconductor film, a fourth step of adding a doping impurity to the semiconductor film using said gate electrode and said mask material as a mask and a fifth step of activating the introduced impurity by applying heat annealing to said semiconductor film.

11. A method of manufacturing a semiconductor circuit as defined in claim 10, wherein the annealing is applied in a hydrogen atmosphere.

12. A method of manufacturing a semiconductor circuit as defined in claim 10, wherein the mask material for the thin film diode is left after formation of the semiconductor circuit.

13. A method of manufacturing a semiconductor circuit comprising:

a first step of forming a semiconductor film substantially in an amorphous state on a substrate, a second step of forming an insulation film, a gate electrode of a thin film transistor and a mask material for a thin film diode on said semiconductor film, wherein said thin film transistor and said thin film diode is formed from said amorphous semiconductor film, a third step of adding a catalyst element for promoting crystallization and a doping impurity of a first conductivity type to the semiconductor film using said gate electrode and said mask material as a mask, wherein said catalyst element is added only to areas of said amorphous semiconductor film in which said doping impurity is added, a fourth step of forming a mask selectively on said semiconductor film and adding a second doping impurity of a conductivity type opposite to that of said first conduction type, and a fifth step of activating introduced impurity by applying heat annealing to said semiconductor film.

14. A method of manufacturing a semiconductor circuit as defined in claim 13, wherein the annealing is applied in a hydrogen atmosphere.

15. A method of manufacturing a semiconductor circuit as defined in claim 13, wherein the mask material for the thin film diode is left after formation of the semiconductor circuit.

\* \* \* \* \*